(12) United States Patent
Niu et al.

(10) Patent No.: US 9,696,923 B2
(45) Date of Patent: Jul. 4, 2017

(54) RELIABILITY-AWARE MEMORY PARTITIONING MECHANISMS FOR FUTURE MEMORY TECHNOLOGIES

(71) Applicants: Dimin Niu, Sunnyvale, CA (US); Mu-Tien Chang, San Jose, CA (US); Hongzhong Zheng, Sunnyvale, CA (US)

(72) Inventors: Dimin Niu, Sunnyvale, CA (US); Mu-Tien Chang, San Jose, CA (US); Hongzhong Zheng, Sunnyvale, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 27 days.

(21) Appl. No.: 14/813,097

(22) Filed: Jul. 29, 2015

(65) Prior Publication Data
US 2016/0266824 A1 Sep. 15, 2016

Related U.S. Application Data

(60) Provisional application No. 62/131,232, filed on Mar. 10, 2015.

(51) Int. Cl.
| | | |
|---|---|---|
| G11C 29/00 | (2006.01) |
| G06F 3/06 | (2006.01) |
| G06F 11/10 | (2006.01) |
| G06F 12/02 | (2006.01) |
| G11C 5/02 | (2006.01) |
| G11C 5/14 | (2006.01) |
| G11C 5/04 | (2006.01) |

(52) U.S. Cl.
CPC .......... *G06F 3/0619* (2013.01); *G06F 3/0659* (2013.01); *G06F 3/0688* (2013.01); *G06F 11/1076* (2013.01); *G06F 12/02* (2013.01); *G11C 5/025* (2013.01); *G11C 5/14* (2013.01); *G11C 5/04* (2013.01)

(58) Field of Classification Search
CPC ..... G06F 3/0619; G06F 3/0659; G06F 3/0688
See application file for complete search history.

(56) References Cited

U.S. PATENT DOCUMENTS

| | | | |
|---|---|---|---|
| 8,589,766 B2 | 11/2013 | Post et al. | |
| 8,694,859 B2 | 4/2014 | Shalvi et al. | |
| 8,862,952 B1* | 10/2014 | Booth | G11C 16/3468 711/103 |
| 2007/0195631 A1* | 8/2007 | Hoffmann | G11C 7/06 365/230.03 |
| 2013/0007566 A1* | 1/2013 | Shalvi | G11C 16/349 714/773 |
| 2014/0281819 A1 | 9/2014 | Wood et al. | |

* cited by examiner

*Primary Examiner* — Sam Rizk
(74) *Attorney, Agent, or Firm* — Renaissance IP Law Group LLP

(57) ABSTRACT

A memory module (735) can include a memory array (105) and a memory controller (740). The memory controller (740) can include a status register (745) that specifies whether the memory module (735) is operating at normal power or low power. A normal reliability region (305, 505) and a low reliability region (310, 510) can be defined in the memory array (105), based on the power level specified by the status register (745).

28 Claims, 19 Drawing Sheets

| | | Second Error Correcting Circuitry | | |
|---|---|---|---|---|
| | | No Error | Single Bit Error | Multi Bit Error |
| First Error Correcting Circuitry | No Error | No errors in data vector: use data vector 1810 | Uncorrectable error 1815 | Uncorrectable error 1820 |
| | Single Bit Error | One known Stuck-At error: use alternate data vector 1825 | If both ECCs indicate error at the same position, one soft bit error, use data vector after ECC correction; otherwise, uncorrectable error 1830 | Multiple soft bit errors and a Stuck-At error: data cannot be corrected 1835 |
| | Multi Bit Error | Uncorrectable error 1840 | One Stuck-At error and one soft bit error: use alternate data vector after ECC correction 1845 | Multiple soft bit errors: data cannot be corrected 1850 |

RELIABILITY-AWARE MEMORY PARTITIONING MECHANISMS FOR FUTURE MEMORY TECHNOLOGIES

RELATED APPLICATION DATA

This application claims the benefit of U.S. Provisional Patent Application Ser. No. 62/131,232, filed Mar. 10, 2015, which is hereby incorporated by reference for all purposes.

FIELD

The inventive concept pertains to memory, and more particularly to memory with regions with different reliability levels.

BACKGROUND

The cost (or cost per bit) of a memory design is highly dependent on the area of the memory array. Larger array areas lead to better area efficiency (a lower cost per bit), because of the easier routing of interconnections, and more shared components such as row decoders, column decoders, sense amplifiers and buffers.

For example, FIGS. 1A and 1B show two different designs for a memory module, offering the same memory capacity. In FIG. 1A, memory array 105 is shown, which is accessed using row decoder 110 and column decoder 115. (FIGS. 1A-FIG. 1B are simplified drawings of a memory module: a person skilled in the art will recognize that there can be significantly more elements and circuitry in a memory module than are shown in FIGS. 1A-1B.)

In contrast to FIG. 1A, FIG. 1B shows four smaller memory arrays, such as memory array 120. Each smaller memory array 120 has its own row decoder 125 and column decoder 130. As can be seen, the footprint of the memory module in FIG. 1A is smaller than the footprint of the memory module in FIG. 1B.

The size of a memory array is limited by many constraints. These constraints can include the read noise margin requirements, latency requirements, and others. In addition, both emerging non-volatile memory (NVM) and future dynamic random access memory (DRAM) design can impose additional constraints to the memory array design. NVM designs can use vertically connected devices as cell selectors, such as single direction bipolar junction transistors (BJTs) or diode devices, and bi-direction devices. These designs can reduce the cell size of NVMs. But these designs also introduce larger sneak currents at wordlines and bitlines.

Increasing the size of DRAM memory arrays means that more bits can be packed into the same amount of space on a DRAM module. Increasing the size of DRAM memory arrays also permits lower operating voltages and lower costs per bit. But as the operating voltages drop, leakage currents, such as gate leakage current and sub-threshold leakage current, become significant.

The traditional solutions to the problems of NVM designs and DRAM scaling are to reduce the array size or increase the operating voltage. But increasing the array size increases the area required by the memory module, which increases the cost. And increasing the operating voltage increases the power consumed by the memory module. Both of these consequences are undesirable.

A need remains for a way to reduce the implications of sneak currents and leakage currents in memory design.

BRIEF DESCRIPTION OF THE DRAWINGS

FIG. 18 shows a chart of different possible cases based on the results of the error correcting circuitries of FIG. 15.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art can practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 2B:
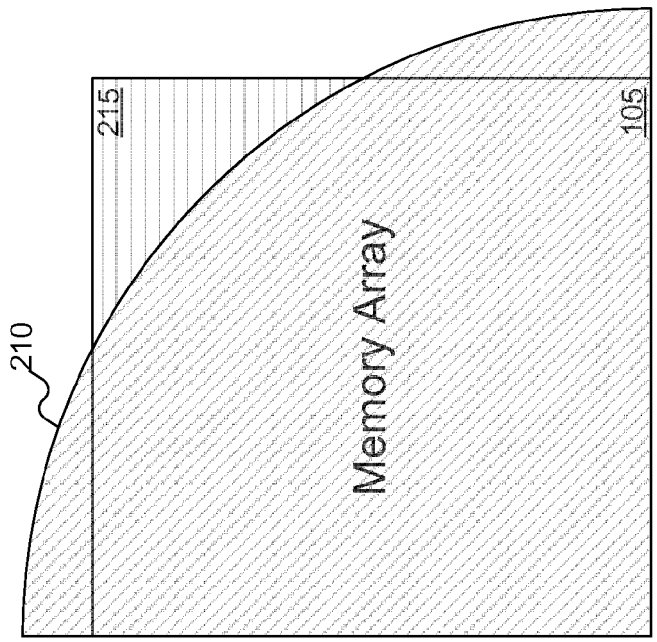
FIGS. 2A-2B compare the reliability of memory modules when different voltages are used.
Figure 2A:
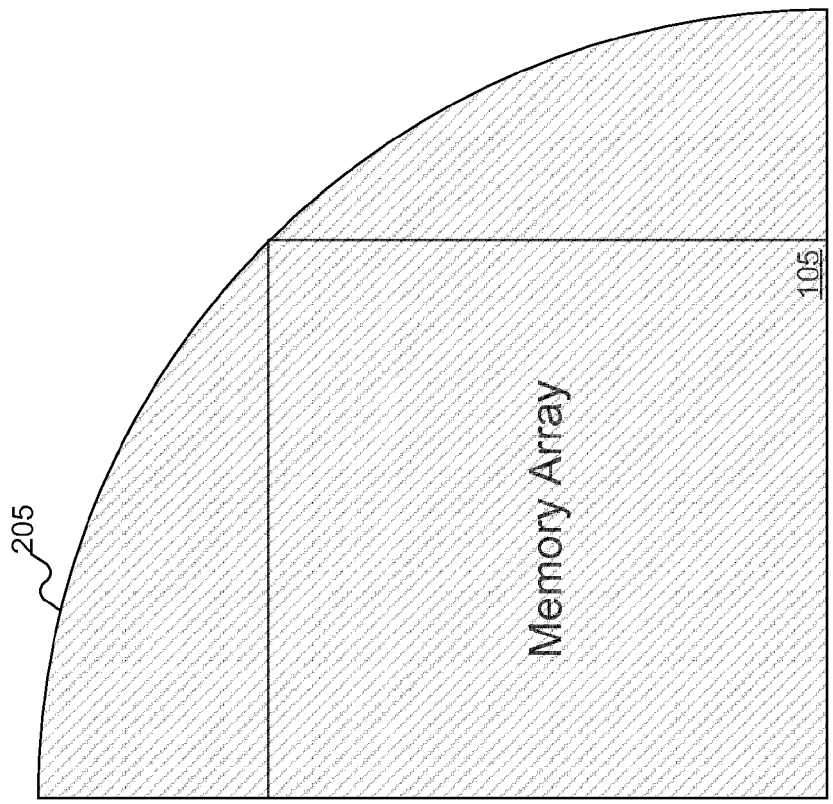

FIGS. 2A-2B compare the reliability of memory modules when different voltages are used. In FIG. 2A, memory array 105 is shown being subjected normal voltage. Circular arc 205 represents an area starting from the voltage source that has normal reliability. That is, as the voltage travels from its source along wordlines and bitlines out across memory array 105, voltage is lost due to various effects, such as leakage and resistance. As the signal travels, it gets weaker. Eventually, the signal travels far enough that it is insufficient to ensure that the data can be reliably read from or written to memory array 105. Circular arc 205 represents the limit of reliable reading and writing of memory array 105.

Using normal voltage, as shown in FIG. 2A, the entirety of memory array 105 can be within circular arc 205. But if the voltage is lower than normal, then part of memory array 105 might not receive a sufficient signal to be able to read or write data reliably. FIG. 2B shows this situation.

As can be seen in FIG. 2B, circular arc 210 includes part of memory array 105. But portion 215 of memory array 105, designated by the vertical crosshatching, is not within the bounds of normal reliability. Thus, portion 215 of memory array 105 has a lower reliability than the rest of memory array 105.

While FIGS. 2A-2B show voltage relative to memory array 105, embodiments of the inventive concept are applicable to any memory array. Thus, memory array 120, with its smaller area (and lower data storage) can be replaced with memory array 105 with no loss in applicability, as could any other memory array. Nor are embodiments of the inventive concept limited to any particular memory technology. Thus, memory array 105 could be a dynamic random access memory (DRAM) array, a non-volatile memory (NVM) array, or any other desired form of memory array.

Figures 1A, 1B:
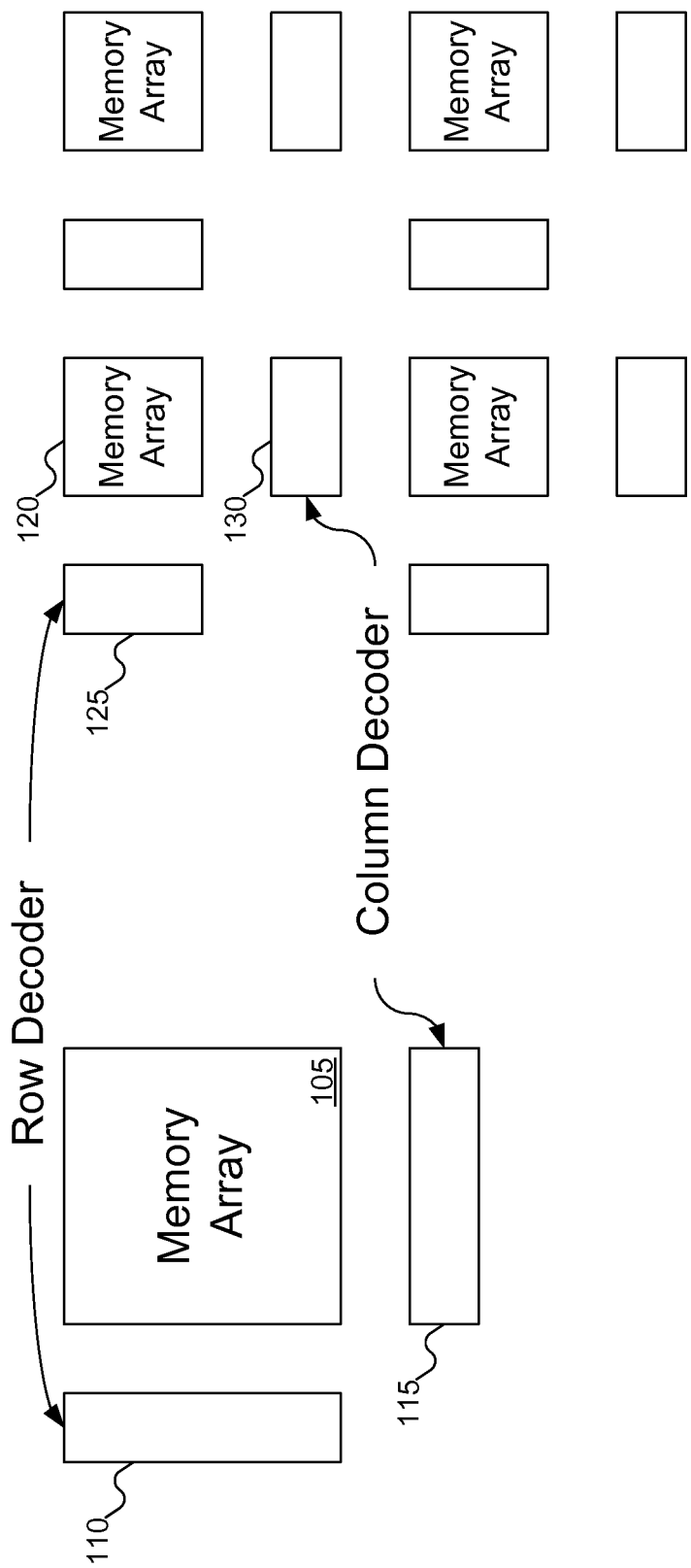
FIGS. 1A-1B compare the footprints required of memory modules using different array sizes.
Figure 3:
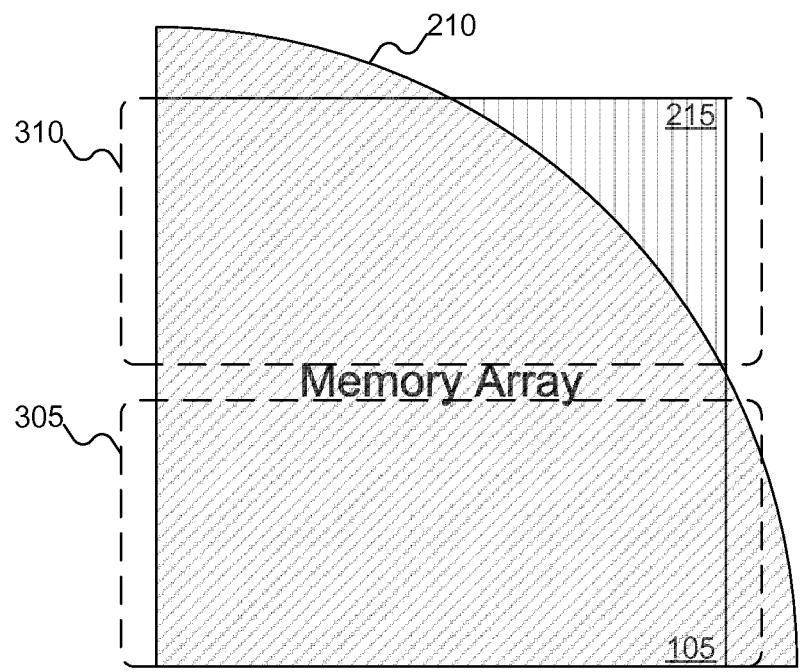
FIG. 3 shows the memory arrays of FIGS. 1A-1B partitioned into regions of differing reliability, based on the lower power level of FIG. 2B, according to an embodiment of the inventive concept.

FIG. 3 shows memory array 105 of FIG. 1A partitioned into regions of differing reliability, based on the lower power level of FIG. 2B, according to an embodiment of the inventive concept. In FIG. 3, memory array 105 is shown, subject to circular arc 210, which represents what data elements in memory array 105 would be considered to have normal reliability at the lower power level. Again, portion 215 represents the portion of memory array 105 that is not considered to have normal reliability: that is, portion 215 of memory array 105 is considered to have low reliability.

Memory array 105 can be partitioned into two regions, such as regions 305 and 310. Region 305 includes data elements of memory array 105 that all have normal reliability, even at low power. In contrast, region 310, which includes portion 215 of memory array 105, includes data elements of memory array 105 that are considered to have low reliability.

The advantage of partitioning memory array 105 into regions, such as regions 305 and 310, is that it becomes possible for the system to know whether a particular data element of memory array 105 has normal reliability or low reliability. All that is needed is for the system to determine which region the data element is in, and whether that region is considered to have normal reliability or low reliability.

Figure 4:
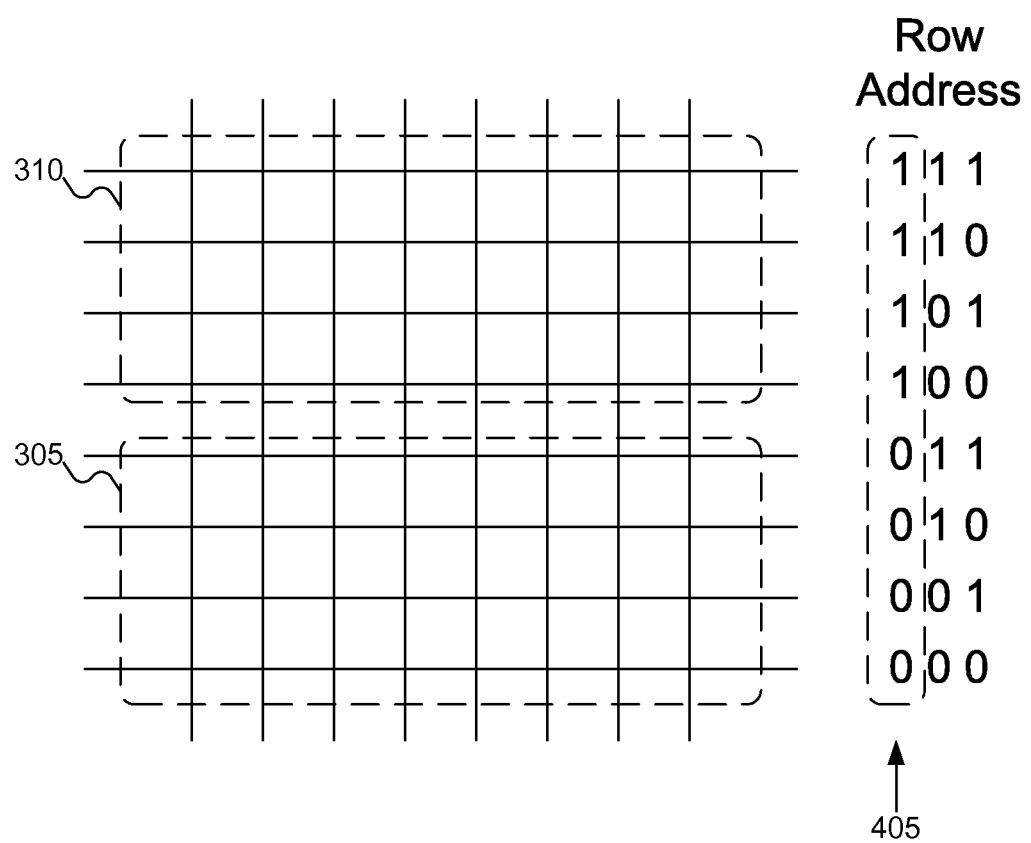
FIG. 4 shows the regions of FIG. 3 assigned using the row addresses of cells in the memory arrays of FIGS. 1A-1B.

FIG. 4 shows the regions of FIG. 3 assigned using the row addresses of cells in memory array 105 of FIG. 1A. In FIG. 4, three bits of the row addresses are shown for each row in regions 305 and 310. As can be seen, circled bits 405 in the row addresses can be used to identify in which region a data element lies. Thus, for example, region 305 includes row addresses in which the circled bit has the value 0, whereas region 310 includes row addresses in which the circled bit has the value 1. Thus, by examining a single bit in the row address, the system can determine if the data element is in region 305 of normal reliability or region 310 of low reliability.

While FIG. 4 shows regions 305 and 310 being identified using the row address of the data elements in the region, using bits in the row address is merely one possible embodiment of the inventive concept. In other embodiments of the inventive concept, any bits in the memory address can be used to identify the region. For example, regions 305 and 310 could be identified by bits in the column address of the data element being accessed, or by any other bits in the memory address.

Figure 5:
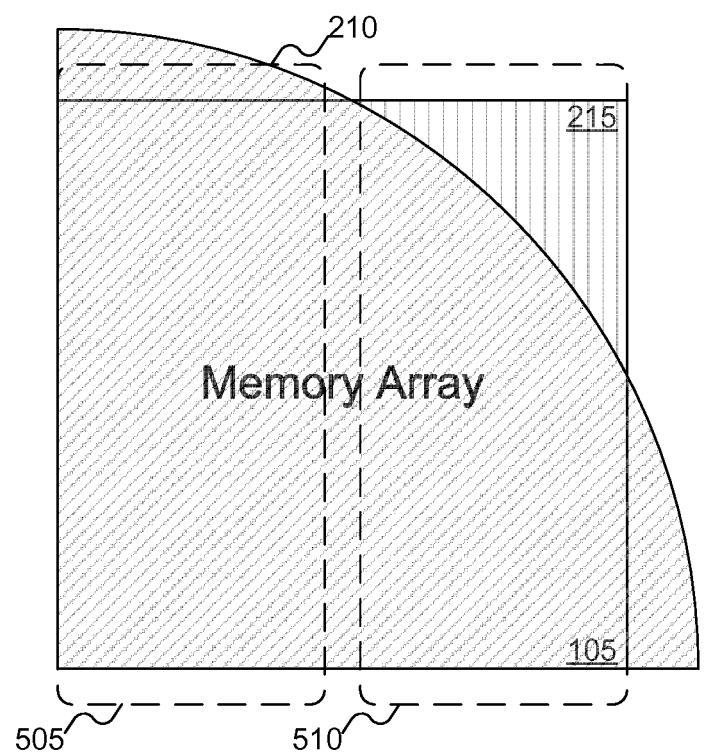
FIG. 5 shows the memory arrays of FIGS. 1A-1B partitioned into regions of differing reliability, based on the lower power level of FIG. 2B, according to a second embodiment of the inventive concept.
Figure 6:
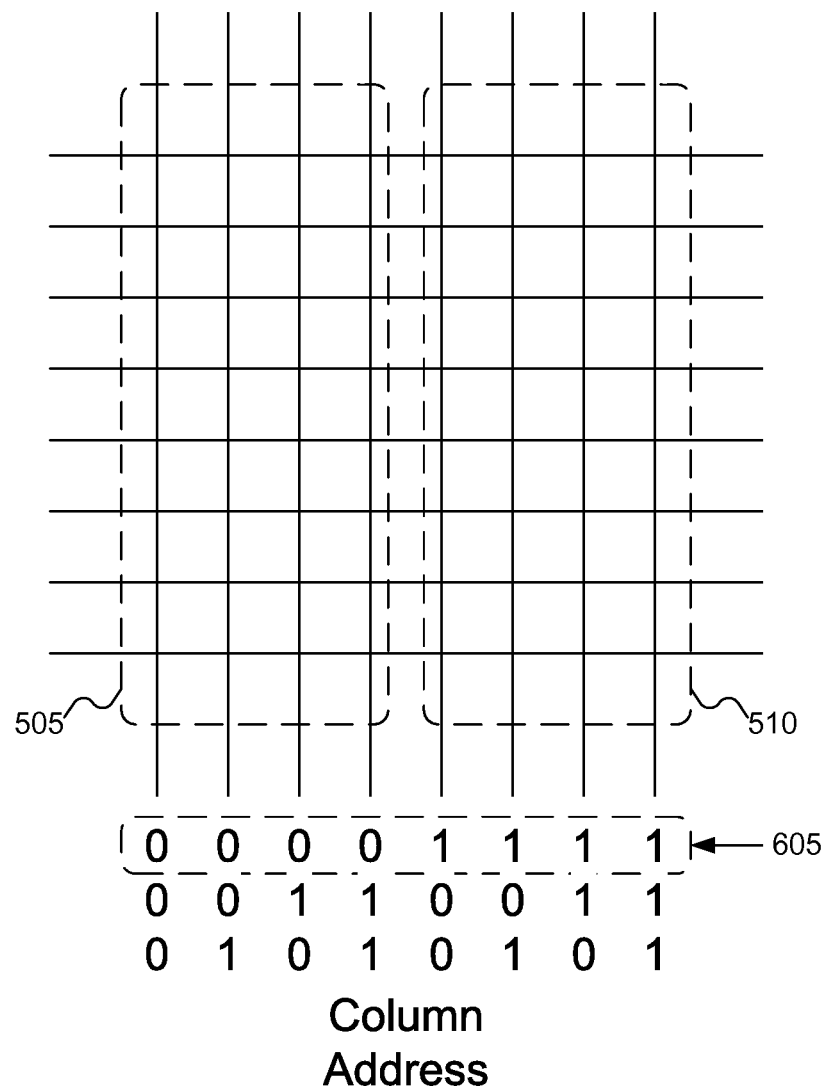
FIG. 6 shows the regions of FIG. 3 assigned using the column addresses of cells in the memory arrays of FIGS. 1A-1B.

FIGS. 5-6 show the memory arrays of FIGS. 1A-1B partitioned into regions of differing reliability, but using column addressing rather than row addressing, according to a second embodiment of the inventive concept. In FIG. 5, regions 505 and 510 are shown arranged in columns rather than rows. In FIG. 6, three bits of the column addresses are shown for each column in regions 505 and 510: circled bits 605 can be used to identify in which region a data element lies.

While FIGS. 3-6 show two regions—one with normal reliability and one with low reliability—there is no reason that additional regions could not be defined. For example, memory array 105 could be partitioned into four regions, some of which have normal reliability and some of which have low reliability. In addition, the number of regions that have normal reliability does not have to match the number of regions with low reliability. For example, there could be one region with low reliability and three regions with normal reliability, or vice versa. Finally, although having the number of regions be a power of two has an advantage that a region can be identified using a subset of bits in the memory address, memory array 105 can be partitioned into any number of regions.

Figure 7:
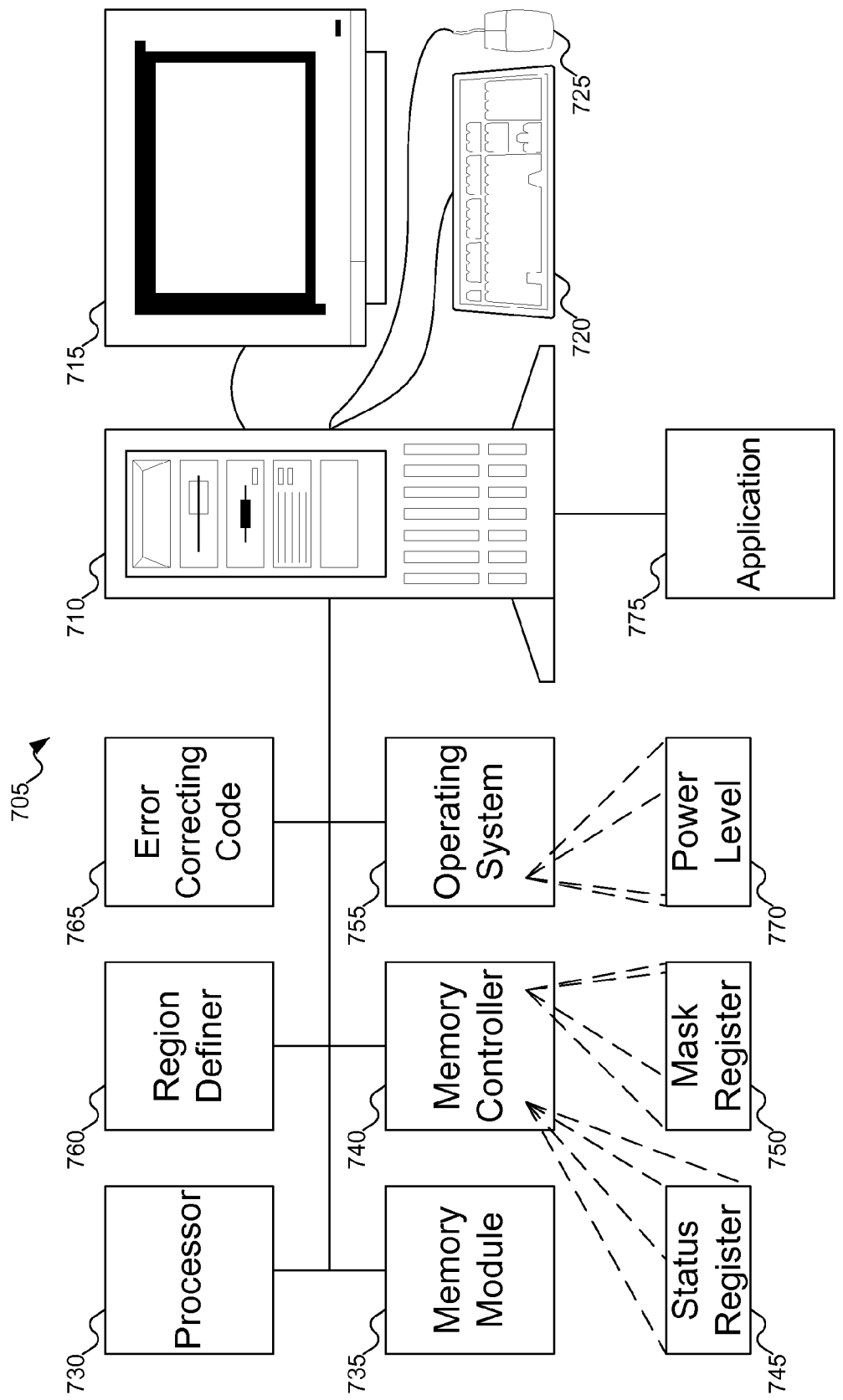
FIG. 7 shows a computer system in which the memory modules of FIGS. 3-6 can be used.

FIG. 7 shows a computer system in which the memory modules of FIGS. 3-6 can be used. In FIG. 7, computer system 705 is shown as including computer 710, monitor 715, keyboard 720, and mouse 725. A person skilled in the art will recognize that other components can be included with computer system 705: for example, other input/output devices, such as a printer, may be included. In addition, computer system 705 can include conventional internal components such as central processing unit 730, memory module 735, and memory controller 740. Although not shown in FIG. 7, a person skilled in the art will recognize that computer system 705 can include other internal components, such as other storage devices. In addition, a person skilled in the art will recognize that computer system 705 can interact with other computer systems, either directly or over a network (not shown) of any type. Finally, although FIG. 7 shows computer system 705 as a conventional desktop computer, a person skilled in the art will recognize that computer system 705 can be any type of machine or computing device, including, for example, a laptop computer, a tablet computer, a personal digital assistant (PDA), or a smart phone, among other possibilities.

Memory controller 740 can include status register 745 and mask register 750. Status register 745 can specify whether memory module 735 is operating in a normal power state or a low power state. Mask register 750 can specify how reliable low power region 310 or 510 of memory array 105 is. For example, mask register 750 might specify what percentage of data elements in low power region 310 or 510 are operating at a power level sufficiently low that they cannot be considered reliable. Or mask register 750 might specify the average probability that a particular read or write operation in low power region 310 or 510 will not be executed correctly: that is, incorrect data will be written or incorrect data will be read. Regardless of the particular form of data stored in mask register 750, mask register 750 can provide information about the overall reliability of low power region 310 or 510. In general, mask register 750 can be calculated using a formula that relates the power of memory module 735 to its overall reliability. For example, in a cross-point resistive memory array, a 20% reduction in voltage typically causes no more than 12.5% of data elements in the memory array to be unreliable. Thus, given a particular power level for memory module 735, the reliability level stored in mask register 750 can be readily computed.

As noted above, status register 745 can specify the power state of memory module 735. Operating system 755 can set status register 745 when computer system 705 is in use. For example, upon the initial start of operating system 755, operating system 755 can decide whether memory module 735 will operate using a normal power state or a low power state, and can store the value in status register 745 accordingly. In some embodiments of the inventive concept, once the power state of memory module 735 is set it is not changed until computer system 705 is rebooted. In other embodiments of the inventive concept, operating system 755 can change the power state of memory module 735 during the use of computer system 705 as desired.

Computer system 705 can also include other components, such as region definer 760 and error correcting code 765. Region definer 760 can be used to partition memory array 105 (which can be part of memory module 735) into regions, as described above with reference to FIGS. 3-6. Because the reduction in reliability for certain data elements in memory module 735 is mathematically related to the distance between those data elements and the voltage source, region definer 760 can use this mathematical relationship to partition memory array 105 into regions. In addition, again because the reduction in reliability for data elements is mathematically related to the distance between those data elements and the voltage source, region definer 760 can define multiple regions, each with different reliability levels. For example, one region might have normal reliability, another region might be 95% reliable, another region might be 90% reliable, and another region might be 85% reliable. If region definer 760 defines regions with multiple reliability levels, then mask register 750 can either store the lowest reliability level for any region, or mask register can store the different reliability levels for the different regions.

FIG. 7 shows region definer 760 included in computer system 705. Including region definer 760 can enable memory module 735 to use voltages where the voltages that can be applied to memory module 735 might not be known in advance. If the voltages that can be applied to memory module 735 are not known in advance, then the reliability of various data elements in memory array 105 cannot be computed in advance, which means that the particular regions and their reliability levels cannot be computed in advance. But in another embodiment of the inventive concept, computer system 705 can have reliability information hard-coded. That is, computer system 705 can store (for example, in memory controller 740) that only two different voltage levels can be applied to memory module 735, and that memory module 735 is to be divided into exactly two regions using row addressing. With this additional information, it is possible to pre-compute information about regions 305 (or 505) and 310 (or 510) and their respective reliability levels in memory array 105. In such an embodiment of the inventive concept, region definer 760 can be omitted.

Operating system 730 can also include power level 770, which can enable operating system 730 to experiment with different power levels and determine different reliabilities for memory module 735. For example, operating system can select two, three, four, or more distinct power levels to use with memory module 735, and can determine the corresponding regions and their respective reliabilities for each potential power level. Operating system 730 can then select a power level to use and can store the selected power level in status register 745.

Error correcting code 765 can be used in conjunction with memory array 105 in an attempt to offset the low reliability of region 310 or 510. That is, data stored in region 310 or 510 of memory array 105 can be encoded using error correcting code 765. Then, if error correcting code 765 indicates that the data read from a data element in region 310 or 510 of memory array 105 is not correct, a correction can be attempted using error correcting code. Without limiting embodiments of the inventive concept to a particular implementation, Hamming codes are examples of error correcting codes that can be used with embodiments of the inventive concept. Other forms of error correcting codes that can be used with limitation include the error correcting codes described in related U.S. patent application Ser. No. 14/789,877, titled "PARTIAL PARITY ECC CHECKING MECHANISM WITH MULTI-BIT HARD AND SOFT ERROR CORRECTION CAPABILITY", filed Jul. 1, 2015, and U.S. patent application Ser. No. 14/751,126, titled "MULTIPLE ECC CHECKING MECHANISM WITH MULTI-BIT HARD AND SOFT ERROR CORRECTION CAPABILITY", filed Jun. 25, 2015, both of which are incorporated by reference herein for all purposes, and are described to some extent below in Appendices A and B.

Different regions can use different error correcting codes, based on the reliability of the regions. For example, a region considered 100% reliable might use no error correcting code (or a simple parity bit), a region that is considered 90% reliable might use an error correcting code that can correct for a single-bit error, a region that is 80% reliable might use an error correcting code that can correct for a double-bit error (such as using the above-referenced codes), and a region that is 70% reliable might use an error correcting code that can correct for a triple-bit error (such as using the above-referenced codes). Other embodiments of the inventive concept can use different error correcting codes for different regions.

In one embodiment of the inventive concept, error correcting code 765 can be a separate component of computer system 705. In another embodiment of the inventive concept, error correcting code 765 can be part of operating system 755. In yet another embodiment of the inventive concept, error correcting code 765 can be part of application 775. In further embodiments of the inventive concept, error correcting code 765 can be part of memory module 735 or memory controller 740.

Depending on where error correcting code 765 is included, responsibility for its use can vary. For example, if error correcting code 765 is part of operating system 755, then operating system 755 can use error correcting code 765 as data is written to or read from memory array 105, without application 775 having to take responsibility for using error correcting code 765. In this manner, application 775 does not even have to know whether its data is being stored in normal reliability region 305 or 505 or in low reliability region 310 or 510. In theory, application 775 does not even need to know whether its data is being stored in normal reliability region 305 or 505 or low reliability region 310 or 510, if the error correcting code can adequately compensate for any possible errors in writing or reading the data.

On the other hand, application 775 can provide a hint about where it would prefer its data be stored. For example, application 775 might indicate that it requires its data to be at least 90% reliable. In that case, computer system 705 can use status register 745 and mask register 750 to determine whether data for application 775 can be stored in normal reliability region 305 or 505, or whether data for application 775 should be stored in low reliability region 310 or 510. Of course, if status register 745 indicates that memory module 735 is operating in a normal power state, then all data elements in memory module 735 are equally reliable, and there is no need for a hint from application 775. But if status register 745 indicates that memory module 735 is operating at low power, then computer system 705 can access mask register 750 to determine the reliability of low power region 310 or 510 in memory array 105. If mask register 750 indicates that low power region 310 or 510 is sufficiently reliable for application 775, then memory can be allocated from low power region 310 or 510. Otherwise, memory can be allocated from normal power region 305 or 505.

As discussed above, region definer 760 can define multiple regions, each with a different reliability. In that case, computer system 705 can determine the region that has the lowest reliability that satisfies the application, and use that region.

Figure 8:
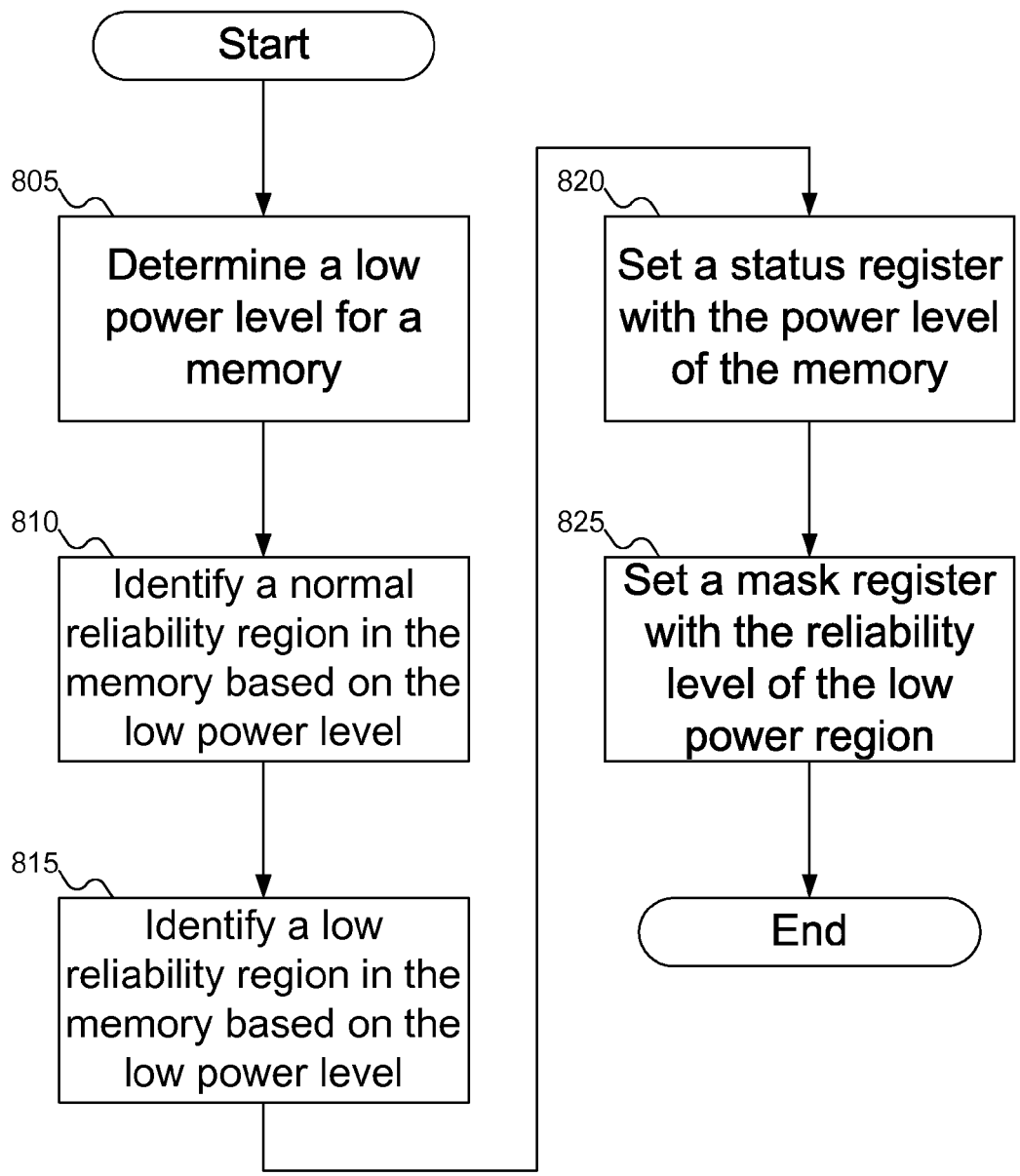
FIG. 8 shows a flowchart of a procedure for dividing a memory array into regions of differing reliability, according to an embodiment of the inventive concept.

FIG. 8 shows a flowchart of a procedure for dividing memory array 105 into regions of differing reliability, according to an embodiment of the inventive concept. In FIG. 8, at block 805, operating system 755 can determine one or more low power levels for memory module 735. At block 810, region definer 760 can define normal power region 305 or 505 for memory array 105. At block 815, region definer 760 can define low power region 310 or 510 for memory array 105. At block 820, operating system 755 can store the power level in status register 745 of memory controller 740. And at block 825, operating system 755 can store the reliability level for low power region 310 or 510 of memory array 105 in mask register 750.

In FIG. 8 (and in the other flowcharts below), one embodiment of the inventive concept is shown. But a person skilled in the art will recognize that other embodiments of the inventive concept are also possible, by changing the order of the blocks, by omitting blocks, or by including links not shown in the drawings. All such variations of the flowcharts are considered to be embodiments of the inventive concept, whether expressly described or not.

Figure 9:
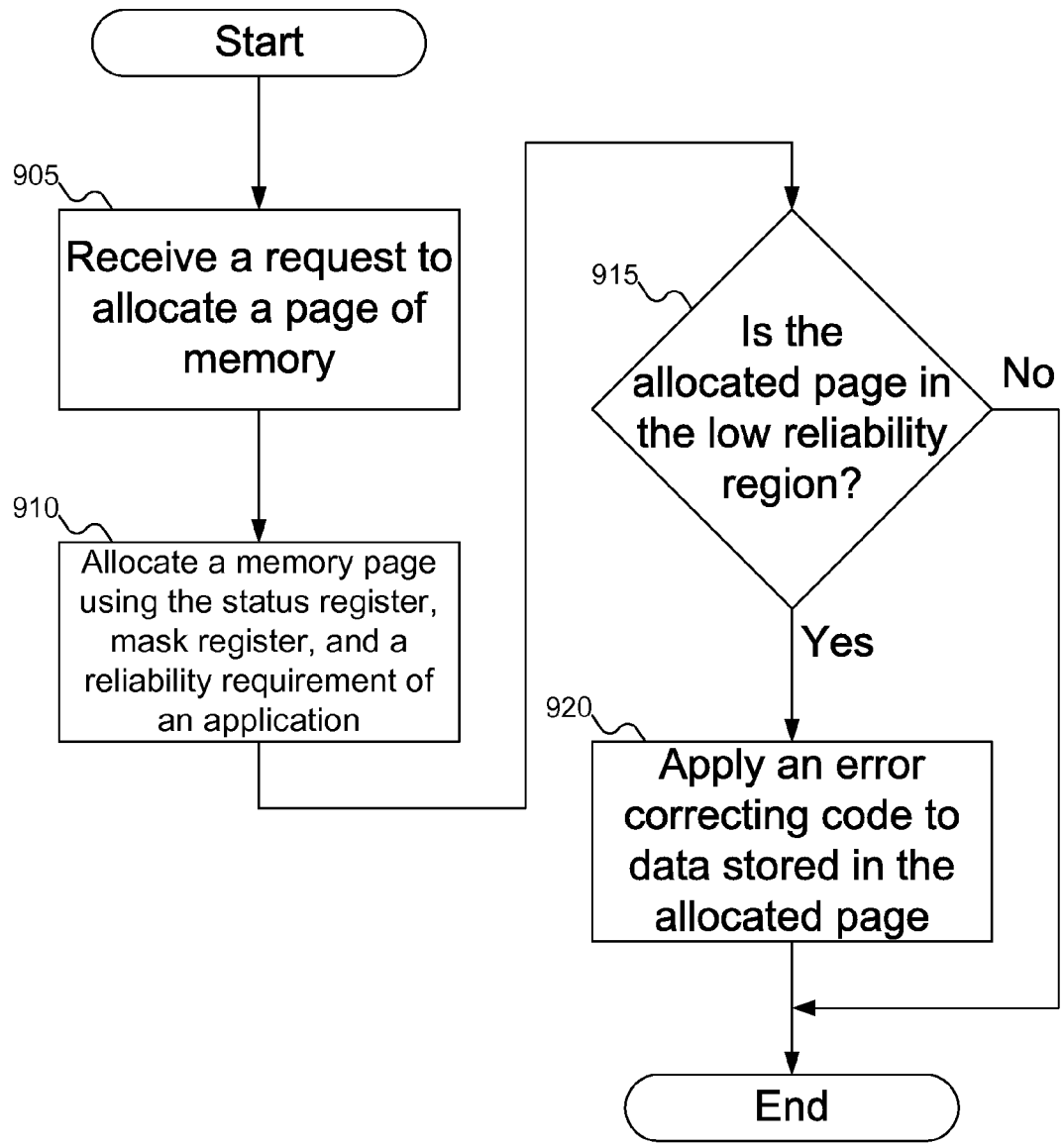
FIG. 9 shows a flowchart of a procedure for using regions of differing reliability to allocate pages of memory, according to an embodiment of the inventive concept.

FIG. 9 shows a flowchart of a procedure for using regions of differing reliability to allocate pages of memory, according to an embodiment of the inventive concept. In FIG. 9, at block 905, operating system 755 can receive a request to allocate some memory, such as a page of memory. At block 910, memory controller 740 can allocate the requested memory, based on the status register, mask register, and a reliability requirement of the application requesting the memory. At block 915, operating system 755 can determine if the allocated memory is in low power region 310 or 510. If so, then at block 920, operating system 755, application 220, memory controller 740, or some other component of computer system 705 can apply error correcting code 765 to the data stored in the allocated memory.

In FIGS. 8 and 9, and in the other flowcharts below, specific structures are described as performing various functions. These specific structures are exemplary, and can be replaced by other structures, as described above. For example, operating system 755, application 220, and memory controller 740 are all described as capable of performing block 920. But other structures are also capable of performing block 920. For example, in some embodiments of the inventive concept memory module 735 can also perform block 920. All such variations are considered to be embodiments of the inventive concept, whether expressly described or not.

Figure 10A:
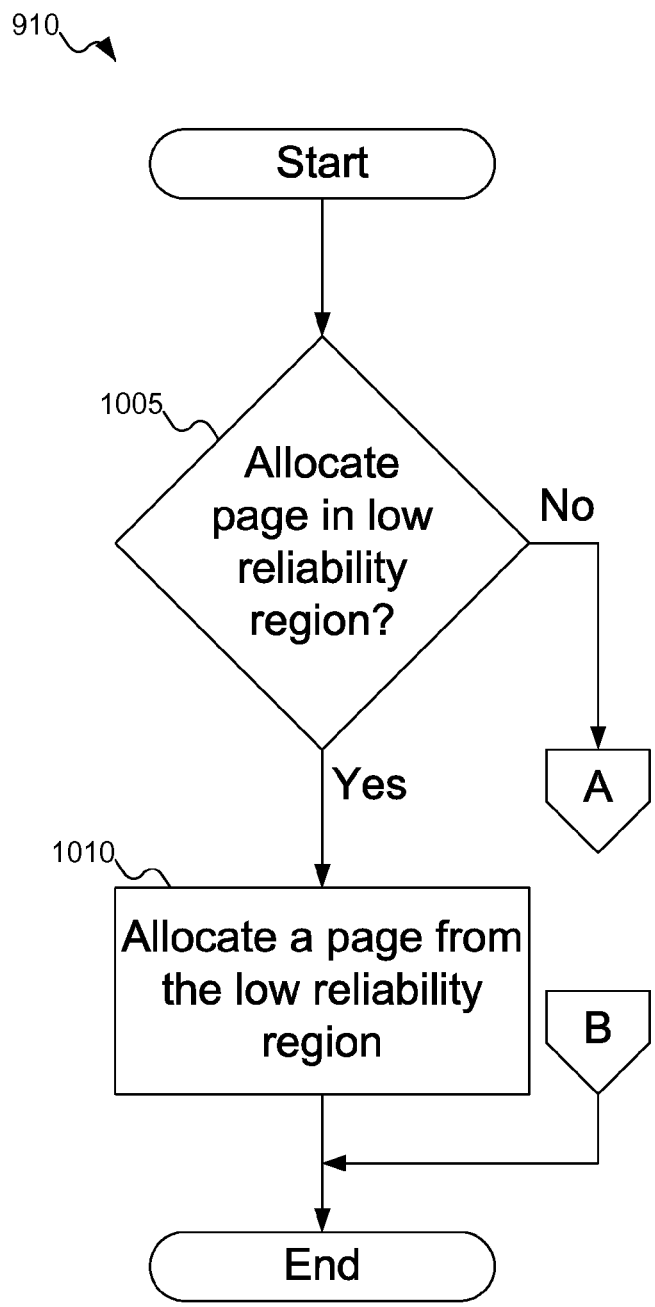
FIGS. 10A-10B show a flowchart of a procedure for allocating a page of memory, according to an embodiment of the inventive concept.
Figure 10B:
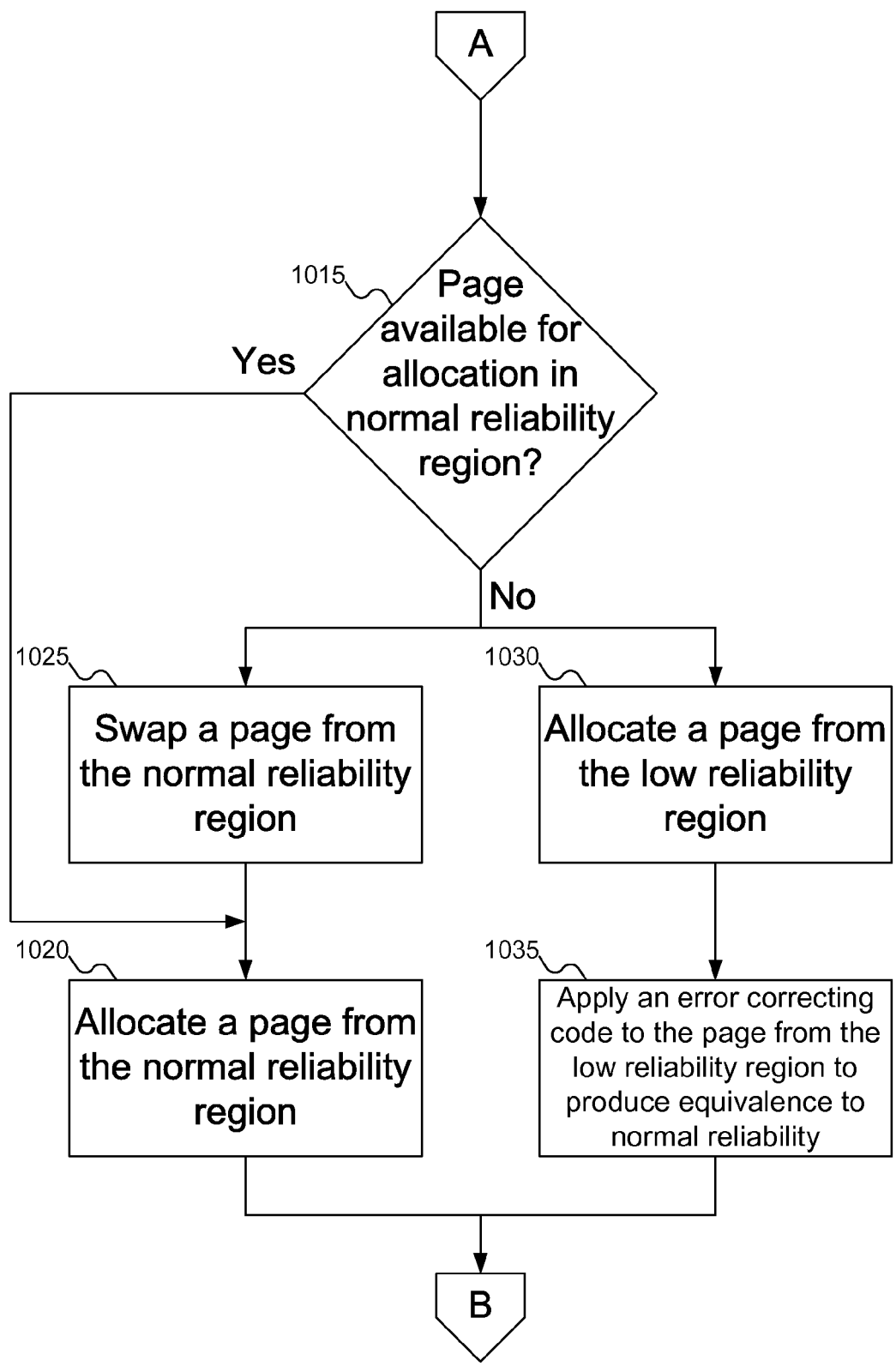

FIGS. 10A-10B show a flowchart of a procedure for allocating a page of memory, as shown in block 910 of FIG. 9, according to an embodiment of the inventive concept. In FIG. 10A, at block 1005, memory controller 740 can determine whether the page to allocate is in low reliability region 310 or 510. If so, then at block 1010, memory controller 740 can allocate the page in low reliability region 310 or 510.

If the page to be allocated is in normal reliability region 305 or 505, then at block 1015 (FIG. 10B), memory controller 740 can determine if there is a page available for allocation in normal reliability region 305 or 505. If so, then at block 1020, memory controller 740 can allocate the page in normal reliability region 305 or 505. But if there is no page available for allocation in normal reliability region 305 or 505, memory controller 740 has alternative approaches.

One solution to the problem of no available pages in normal reliability region 305 or 505 is to free up a page in normal reliability region 305 or 505 by swapping out a page from normal reliability region 305 or 505, as shown at block 1025. Once a page in normal reliability region 305 or 505 has been freed, then memory controller 740 can allocate a page from normal reliability region 305 or 505, as shown in block 1020.

Another solution to the problem of no available pages in normal reliability region 305 or 505 is to allocate a page in low reliability region 310 or 510, as shown in block 1030. Then, to compensate for the fact that the page was allocated from low reliability region 310 or 510, operating system 755, application 220, memory controller 740, or some other component of computer system 705 can apply error correcting code 765 to the allocated page, as shown in block 1035. Note that the use of error correcting code 765 in block 1035 can be a more capable error correcting code than that used in block 920 of FIG. 9, as block 920 can operate on the assumption that application 775 can be satisfied with low reliability memory, and therefore is not necessarily expecting data reliability comparable to a page in normal reliability region 305 or 505.

The alternative solutions of blocks 1025 and 1020 vs. blocks 1030 and 1035 can be used whenever desired. For example, memory controller 740 might use blocks 1025 and 1020 is some situations, and blocks 1030 and 1035 in other situations. In other words, embodiments of the inventive concept can use either or both solutions to the problem of there being no available pages to allocate in normal reliability region 305 or 505. (Note that a lack of available pages in low reliability region 310 or 510 is not a problem: an application can always use a page of memory that is more reliable than is needed.)

Figure 11:
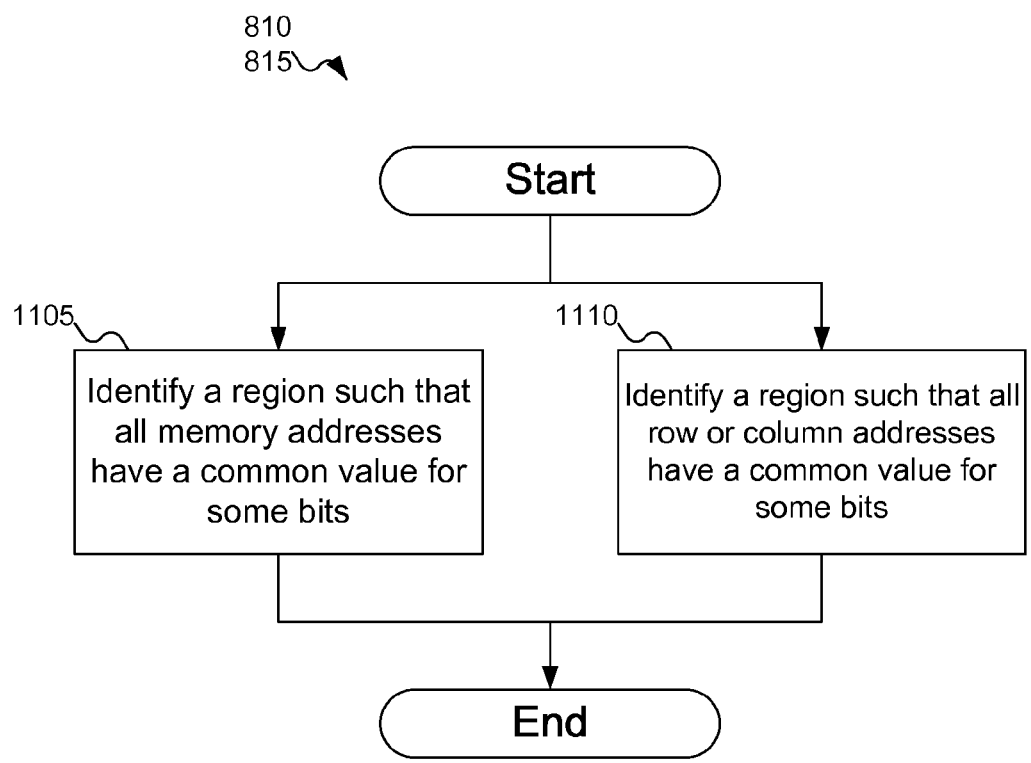
FIG. 11 shows a flowchart of a procedure for defining regions using a region definer, according to an embodiment of the inventive concept.

FIG. 11 shows a flowchart of a procedure for defining regions using region definer 760, according to an embodiment of the inventive concept. In FIG. 11, at block 1105, region definer 760 can identify a region such that all memory addresses in the region have a common value for one or more bits in the memory address. More specifically, at block 1110, region definer 760 can identify a region such that all row addresses (or all column addresses) in the region have a common value for one or more bits in the memory address.

Figure 12A:
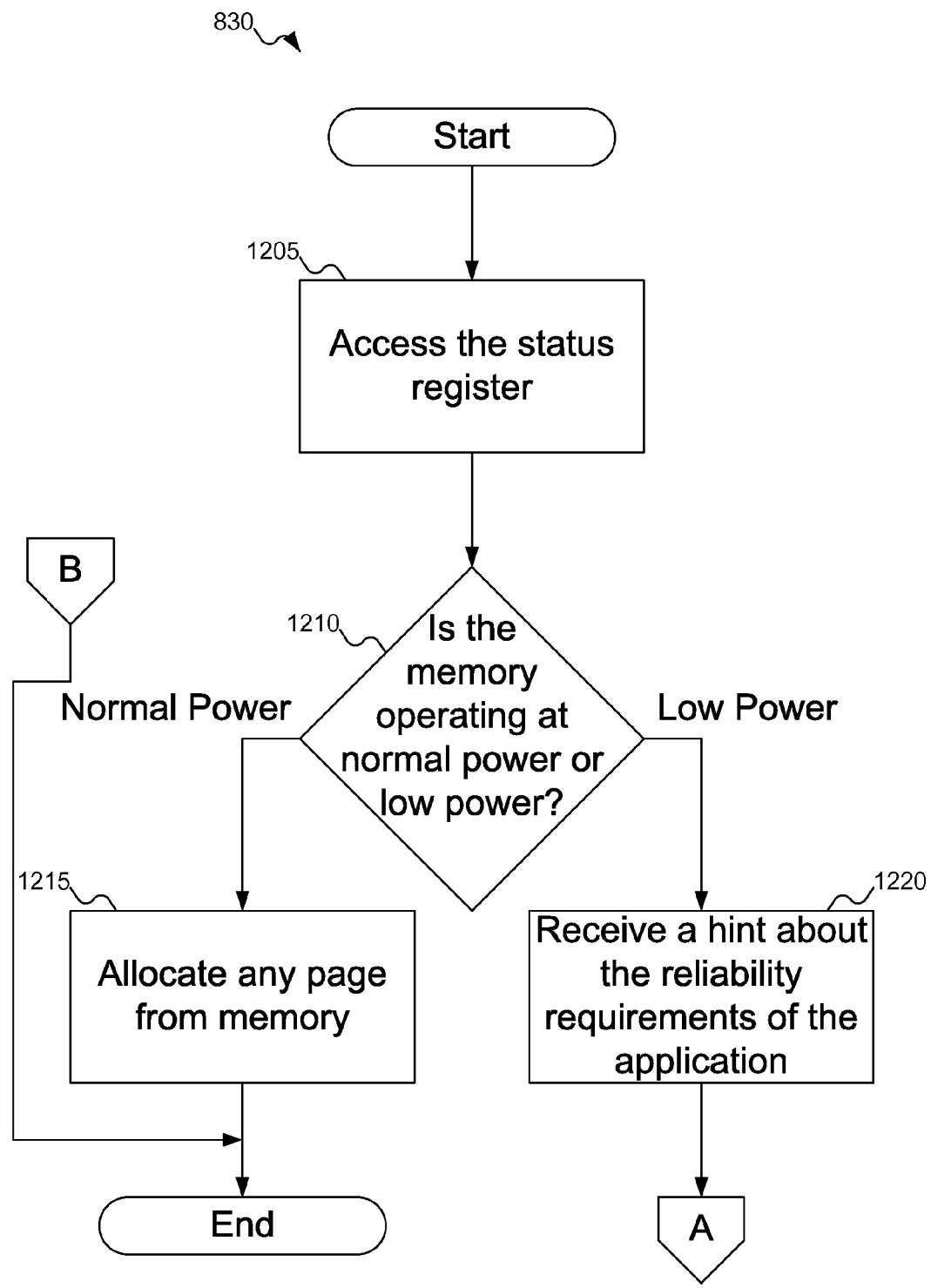
FIGS. 12A-12B show a flowchart of a procedure for allocating a page of memory for an application, according to an embodiment of the inventive concept.
Figure 12B:
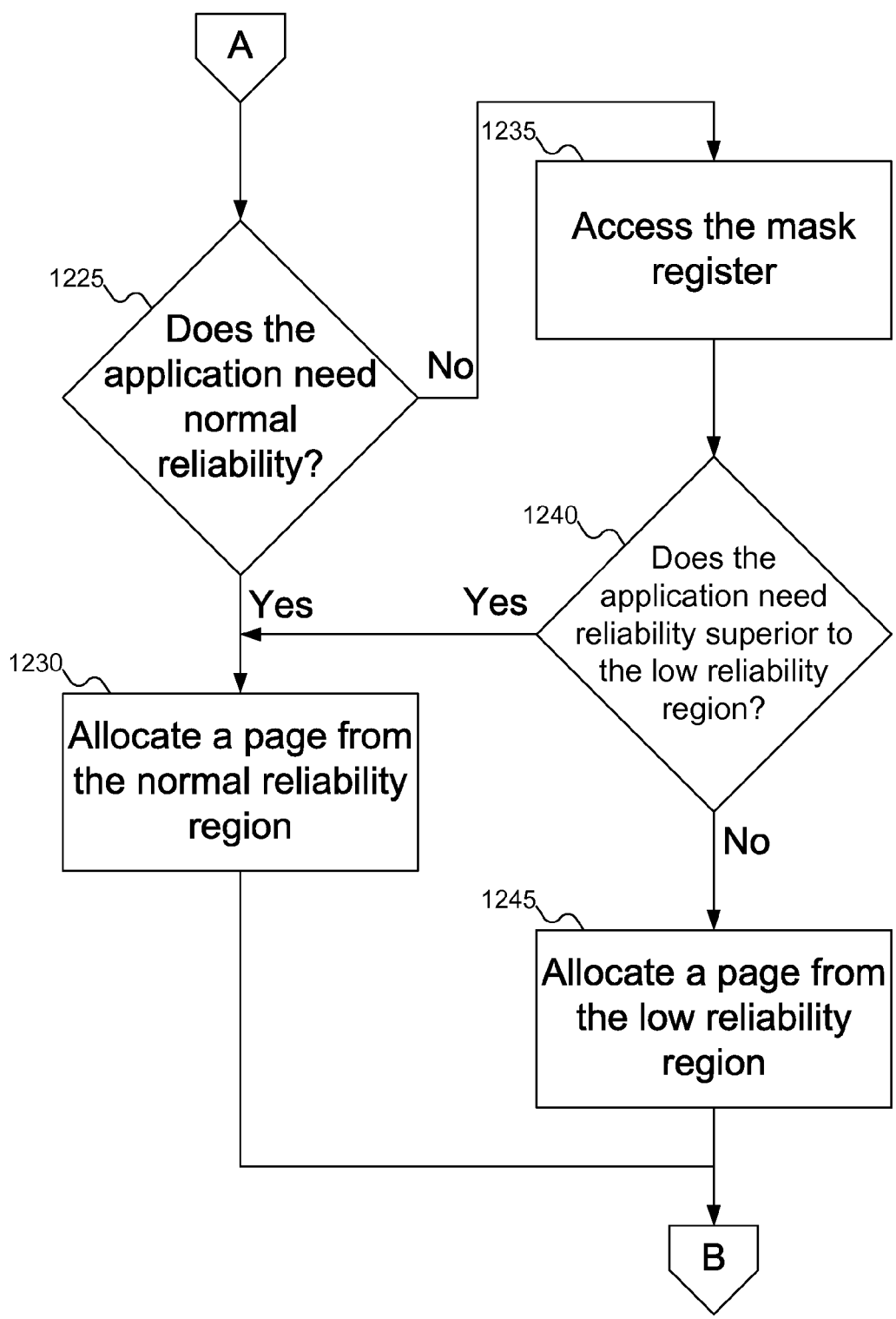

FIGS. 12A-12B show a flowchart of a procedure for allocating a page of memory for application 775, according to an embodiment of the inventive concept. In FIG. 12A, at block 1205, operating system 755 can access status register 745 from memory controller 740. At block 1210, operating system 755 determines if memory module 735 is operating at normal power or low power, as indicated by status register 745. If memory module 735 is operating at normal power, then at block 1215 any memory can be allocated from memory module 735 for application 775.

Alternatively, if memory module 735 is operating at low power, then at block 1220, operating system 755 can receive a hint from application 775 about its reliability requirements. Then, at block 1225 (FIG. 12B), operating system 755 determines if application 775 requires normal reliability. If so, then at block 1230, operating system 755 allocates memory from normal reliability region 305 or 505 of memory array 105, and processing is complete. Alternatively, if application 775 does not require normal reliability, then at block 1235, operating system 755 can access mask register 750 from memory controller 740. At block 1240, operating system 755 can determine if application 775 requires reliability that is superior to the reliability of low reliability region 310 or 510. If so, then control passes to block 1230 to allocate memory from normal reliability region 305 or 505. Otherwise, at block 1245, operating system 755 can allocate memory from low reliability region 310 or 510 for application 775.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Embodiments of the inventive concept can include a tangible, non-transitory machine-readable medium comprising instructions executable by one or more processors, the instructions comprising instructions to perform the elements of the inventive concepts as described herein.

Having described and illustrated the principles of the inventive concept with reference to illustrated embodiments, it will be recognized that the illustrated embodiments can be modified in arrangement and detail without departing from such principles, and can be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the inventive concept can extend to the following statements, without limitation:

Statement 1. An embodiment of the inventive concept includes a memory module, comprising:

a memory array;

a memory controller for the memory array;

a status register in the memory controller, the status register identifying whether the memory module is operating at a normal power level or a low power level; and storage for information defining at least one normal reliability region in the memory array and at least one low reliability region in the memory array when the memory module is operating at the low power level.

Statement 2. An embodiment of the inventive concept includes a memory module according to statement 1, further comprising a region definer to define the at least one normal reliability region in the memory array and the at least one low reliability region in the memory array when the memory module is operating at the low power level.

Statement 3. An embodiment of the inventive concept includes a memory module according to statement 2, wherein the region definer is operative to define the at least one normal reliability region such that all memory addresses in the at least one normal reliability region have a first common value for at least one first bit.

Statement 4. An embodiment of the inventive concept includes a memory module according to statement 3, wherein the region definer is operative to define the at least one normal reliability region such that all row addresses in the at least one normal reliability region have a second common value for at least one second bit.

Statement 5. An embodiment of the inventive concept includes a memory module according to statement 3, wherein the region definer is operative to define the at least one normal reliability region such that all column addresses in the at least one normal reliability region have a second common value for at least one second bit.

Statement 6. An embodiment of the inventive concept includes a memory module according to statement 2, wherein the region definer is operative to define the at least one low reliability region such that all memory addresses in the at least one low reliability region have a first common value for at least one first bit.

Statement 7. An embodiment of the inventive concept includes a memory module according to statement 6, wherein the region definer is operative to define the at least one low reliability region such that all column addresses in the at least one low reliability region have a second common value for at least one second bit.

Statement 8. An embodiment of the inventive concept includes a memory module according to statement 6, wherein the region definer is operative to define the at least one low reliability region such that all row addresses in the at least one low reliability region have a second common value for at least one second bit.

Statement 9. An embodiment of the inventive concept includes a memory module according to statement 1, further comprising a mask register in the memory controller, the mask register specifying a reliability level for the at least one low reliability region.

Statement 10. An embodiment of the inventive concept includes a memory module according to statement 1, further comprising error correcting code circuitry that can be applied to data stored in the at least one low reliability region in the memory address.

Statement 11. An embodiment of the inventive concept includes a memory module according to statement 10, further comprising second error correcting code circuitry that can be applied to data stored in the at least one normal reliability region Statement 12. An embodiment of the inventive concept includes a memory module according to statement 10, wherein:

the error correcting code circuitry can be applied to a first data stored in a first region of the at least one low reliability region; and the memory module further comprises second error correcting code circuitry that can be applied to a second data stored in a second region of the at least one low reliability region.

Statement 13. An embodiment of the inventive concept includes a memory module according to statement 1, wherein the memory controller is operative to:

receive a request to allocate a page of memory;

access the status register; and allocate a page in the at least one normal reliability region or the at least one low reliability region.

Statement 14. An embodiment of the inventive concept includes a memory module according to statement 13, wherein, in response to the status register indicating that the memory module is operating at a normal reliability level, the memory controller is operative to allocate any page in the memory array.

Statement 15. An embodiment of the inventive concept includes a memory module according to statement 13, wherein, in response to the status register indicating that the memory module is operating at the low power level, the memory controller is operative to:

receive a hint from an application regarding a reliability requirement of the application; and allocate the page in the at least one normal reliability region or the at least one low reliability region according to the hint from the application.

Statement 16. An embodiment of the inventive concept includes a memory module according to statement 15, wherein the memory controller is operative to:

receive the hint from the application that the application can use the at least one low reliability region; and allocate the page in the at least one low reliability region.

Statement 17. An embodiment of the inventive concept includes a system, comprising:

a computer;

a processor; and an operating system operative to run on the processor, wherein the operating system is operative to determine a power level for a memory module and to define at least one normal reliability region in the memory module and at least one low reliability region in the memory module.

Statement 18. An embodiment of the inventive concept includes a system according to statement 17, wherein the operating system is operative to store in a status register in a memory controller the power level.

Statement 19. An embodiment of the inventive concept includes a system according to statement 17, wherein the operating system is operative to store in a mask register in a memory controller a reliability level for the at least one low reliability region.

Statement 20. An embodiment of the inventive concept includes a system according to statement 17, further comprising an error correcting code that can be applied to data in a low reliability region in the memory array.

Statement 21. An embodiment of the inventive concept includes a system according to statement 20, wherein the operating system includes the error correcting code.

Statement 22. An embodiment of the inventive concept includes a system according to statement 20, the system further comprising an application operative to run on the processor, the application including the error correcting code.

Statement 23. An embodiment of the inventive concept includes a method, comprising:

determining a low power level for a memory in a computer;

identifying at least one normal reliability region in the memory, based on the low power level;

identifying at least one low reliability region in the memory, based on the low power level; and setting a status register in a memory controller connected to the computer for the memory, the status register specifying whether the memory is operating at a normal power level or the low power level.

Statement 24. An embodiment of the inventive concept includes a method according to statement 23, wherein identifying at least one normal reliability region in the memory includes identifying the at least one normal reliability region in the memory such that all memory addresses in the at least one normal reliability region have a first common value for at least one first bit.

Statement 25. An embodiment of the inventive concept includes a method according to statement 24, wherein identifying the at least one normal reliability region in the memory includes identifying the at least one normal reliability region in the memory such that all row addresses in the at least one normal reliability region have the first common value for the at least one first bit.

Statement 26. An embodiment of the inventive concept includes a method according to statement 24, wherein identifying the at least one normal reliability region in the memory includes identifying the at least one normal reliability region in the memory such that all column addresses in the at least one normal reliability region have the first common value for the at least one first bit.

Statement 27. An embodiment of the inventive concept includes a method according to statement 23, wherein identifying at least one low reliability region in the memory includes identifying the at least one low reliability region in the memory such that all memory addresses in the at least one low reliability region have the second common value for the at least one second bit.

Statement 28. An embodiment of the inventive concept includes a method according to statement 27, wherein identifying the at least one low reliability region in the memory includes identifying the at least one low reliability region in the memory such that all column addresses in the at least one low reliability region have the second common value for the at least one second bit.

Statement 29. An embodiment of the inventive concept includes a method according to statement 27, wherein identifying the at least one low reliability region in the memory includes identifying the at least one low reliability region in the memory such that all row addresses in the at least one low reliability region have the second common value for the at least one second bit.

Statement 30. An embodiment of the inventive concept includes a method according to statement 23, further comprising applying an error correcting code to data stored in the at least one low reliability region.

Statement 31. An embodiment of the inventive concept includes a method according to statement 30, wherein:

applying an error correcting code to data stored in the at least one low reliability region includes applying a first error correcting code to a first data stored in a first region of the at least one low reliability region; and the method further comprises applying a second error correcting code to a second data stored in a second region of the at least one low reliability region.

Statement 32. An embodiment of the inventive concept includes a method according to statement 30, further comprising applying a second error correcting code to a second data stored in the at least one normal reliability region Statement 33. An embodiment of the inventive concept includes a method according to statement 23, further comprising allocating a page of memory according to the status register and a reliability requirement of an application.

Statement 34. An embodiment of the inventive concept includes a method according to statement 33, wherein allocating a page of memory according to the status register and a reliability requirement of an application includes:

accessing the status register; and in response to the status register indicating that the memory is operating at the normal power level, allocating any page in the memory.

Statement 35. An embodiment of the inventive concept includes a method according to statement 34, wherein allocating a page of memory according to the status register and a reliability requirement of an application further includes, in response to the status register indicating that the memory is operating at the low power level:

receiving a hint from the application regarding the reliability requirement;

allocating a page in the memory according to the hint from the application.

Statement 36. An embodiment of the inventive concept includes a method according to statement 35, wherein:

receiving a hint from the application regarding the reliability requirement includes receiving a hint to use the low reliability region; and the method further comprising applying an error correcting code by the application.

Statement 37. An embodiment of the inventive concept includes a method according to statement 34, further comprising setting a mask register in the memory controller in the computer for the memory, the mask register specifying a reliability level for the at least one low reliability region.

Statement 38. An embodiment of the inventive concept includes a method according to statement 37, wherein allocating a page of memory according to the status register and a reliability requirement of an application further includes, in response to the status register indicating that the memory is operating the low power level:

receiving a hint from the application regarding the reliability requirement;

determining whether the hint from the application indicates a region with a reliability greater than the reliability level specified by the mask register;

in response to the hint from the application indicating a region with a reliability greater than the reliability level specified by the mask register, allocating a page from the normal reliability region in the memory; and in response to the hint from the application indicating a region with a reliability not greater than the reliability level specified by the mask register, allocating a page from the low reliability region in the memory.

Consequently, in view of the wide variety of permutations to the embodiments described herein, this detailed description and accompanying material is intended to be illustrative only, and should not be taken as limiting the scope of the inventive concept. What is claimed as the inventive concept, therefore, is all such modifications as may come within the scope and spirit of the following claims and equivalents thereto.

Appendix A

This appendix includes a portion of the disclosure from U.S. patent application Ser. No. 14/789,877, titled "PARTIAL PARITY ECC CHECKING MECHANISM WITH MULTI-BIT HARD AND SOFT ERROR CORRECTION CAPABILITY", filed Jul. 1, 2015.

Embodiments of the inventive concept idea use a set of partial parity check bits to produce a unique check word that can be stored with the data. The check bits are computed such that any number of bit errors in the data bits, the check bits, or a combination of the data and check bits that is less than or equal to the correction capacity of the check code will produce a data/check bit combination that will result in another unique code based on a re-computation of check bits from the possibly faulty data word. If the recomputed check bits are XORed with the check bits (with possible faults) that were read, a syndrome value of the same width can be produced. The syndrome can identify which bits are in error.

Figure 13:
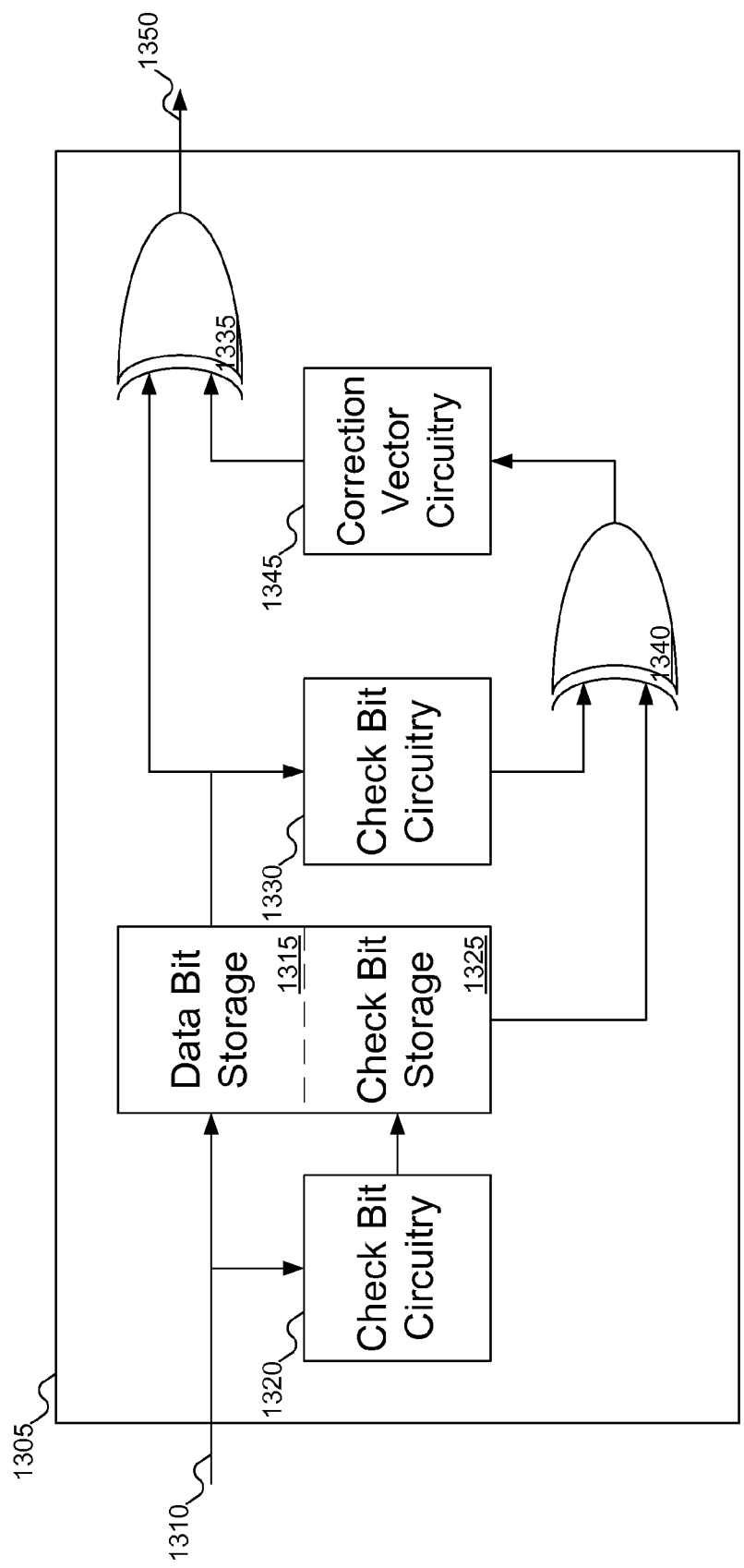
FIG. 13 shows a circuit that can correct multi-bit errors, according to an embodiment of the inventive concept.

FIG. 13 shows a module that can be used to correct multi-bit errors, according to an embodiment of the inventive concept. FIG. 13 will be discussed first at a high level, and then with more specific discussion about certain elements. Module 1305 can be used in any desired element(s) of a computer, but for exemplary purposes, module 1305 is shown as a memory module, such as can be used in Random Access Memory (RAM). Module 1305 does not show control inputs, such as a line for indicating whether data is to be read or written. In addition, module 1305 can be generalized to any desired memory configuration, including data that can be read or written in parallel, among other possibilities.

In FIG. 13, data is input for writing via line 1310. The data is fed into two elements: data storage 1315 and check bit circuitry 1320. Check bit circuitry 1320 can be used to generate the check bits used in the error correcting code in embodiments of the inventive concept. The check bits generated by check bit circuitry 1320 can be stored in check bit storage 1325. Check bit storage 1325 is part of the storage of the module: either module 1305 can be expanded with additional storage for check bit storage 1325, or check bit storage 1325 can be taken from data storage 1315 (with a concordant reduction in the capacity of data storage 1315). In addition, while FIG. 13 shows data storage 1315 and distinct from check bit storage 1325, the check bits can be stored intermixed with the data bits, within a single storage element. All that matters is that the check bits can be processed as check bits, rather than as data bits.

When it is time to read the data, the data from data storage 1315 is accessed. The read data is fed into two elements: check bit circuitry 1330 and XOR gate 1335. Check bit circuitry 1330 generates check bits using the same logic as check bit circuitry 1320. In some embodiments of the inventive concept, check bit circuitry 1320 can be used to generate the check bits after data is read from data storage 1315, reducing the amount of circuitry needed in module 1305.

The check bits can read from check bit storage 1325. The check bits can be read from check bit storage 1325 in parallel with the data bits from data storage 1315, or the timing can be adjusted as appropriate: for example, to ensure that all the inputs to XOR gate 1340 arrive at the same time. The check bits, as read from check bit storage 1325 and as generated by check bit circuitry 1330, are input to XOR gate 1340. XOR gate 1340 then computes a bitwise XOR on the two input sets of check bits. More specifically, XOR gate 1340 computes an XOR on the two bits $C_0$, the two bits $C_1$, and so on for each bitwise pair of check bits.

By XORing individual pairs of check bits, module 1305 can determine whether any individual pairwise check bits do not agree. If a pair of check bits agrees, the result of XOR gate 1340 for those pair of check bits will be 0; if a pair of check bits does not agree, then the result of XOR gate 1340 will be 1. The advantage of computing XOR operations on pairs of check bits is that the comparison can be used to identify the type of error and correct for it, and is discussed further below.

The result of XOR gate 1340, when taken as a sequence of bits, can be termed a syndrome. A syndrome is therefore a bit pattern that can identify what errors have occurred (up to the limits of the error correcting code). That is, a syndrome can identify whether there are 1, 2, 3 ... up to E bit errors between the data bits and the check bits, and which bits are in error. Further, the syndrome can be used to generate a correction vector that can be used to correct for the detected errors. Correction vector circuitry 1345 takes the syndrome output by XOR gate 1340, and generates the appropriate correction vector for the data bits. This correction vector is then input to XOR gate 1335 (along with the data bits read from data storage 1315). The result of XOR gate 1335 is then the correct data, which can be output from module 1305 via line 1350.

Examining FIG. 13 in more detail, some additional discussion about check bit circuitry 1320 and 1330, the calculation of the syndrome by XOR gate 1340, and correction vector circuitry 1345, is warranted. First, as discussed above, check bit circuitry 1320 and 1330 can generate the check bits used in the error correction code. The specifics of how check bit circuitry 1320 and 1330 can generate the check bits depend on the specifics of the error correcting code being used. The number of data bits being encoded and the number of bit errors the code is designed to correct are variables that affect how many check bits are needed. If C represents the number of check bits used in the error correcting codes, D represents the number of data bits being encoded, and E represents the number maximum number of correctable errors, then C is bounded from below by the following two equations:

$$C = E*N$$

$$2^N >= (D+C+1)$$

The number of check bits needed in the error correcting code is bounded from above only by the amount of storage available.

For data of a given size D and a maximum number of correctable errors E, there can be multiple different check bit combinations that will provide the error correcting capability. Each check bit can be generated as an XOR of a fractional subset of the data bits. To be able to detect and correct errors in the data bits, each data bit needs to be included in some subset of the check bits, and each check bit needs to include a different subset of the data bits. In addition, each unique value represented by the data bits needs to result in a unique combination of check bit values.

Any check bit calculation that satisfies these constraints could theoretically be used to produce the desired error correcting code.

In addition to the partial parity check bits, an additional full parity check bit can be computed as an XOR of all the data bits. The full parity check bit can be used to correlate the error count from the syndrome value since a full parity check is equivalent to the number of errors modulo 2. But a full parity check bit is not needed with a partial parity error correcting code because the syndrome space is more sparsely filled in the partial parity method, so there is better inherent uncorrectable error detection.

Figure 14:
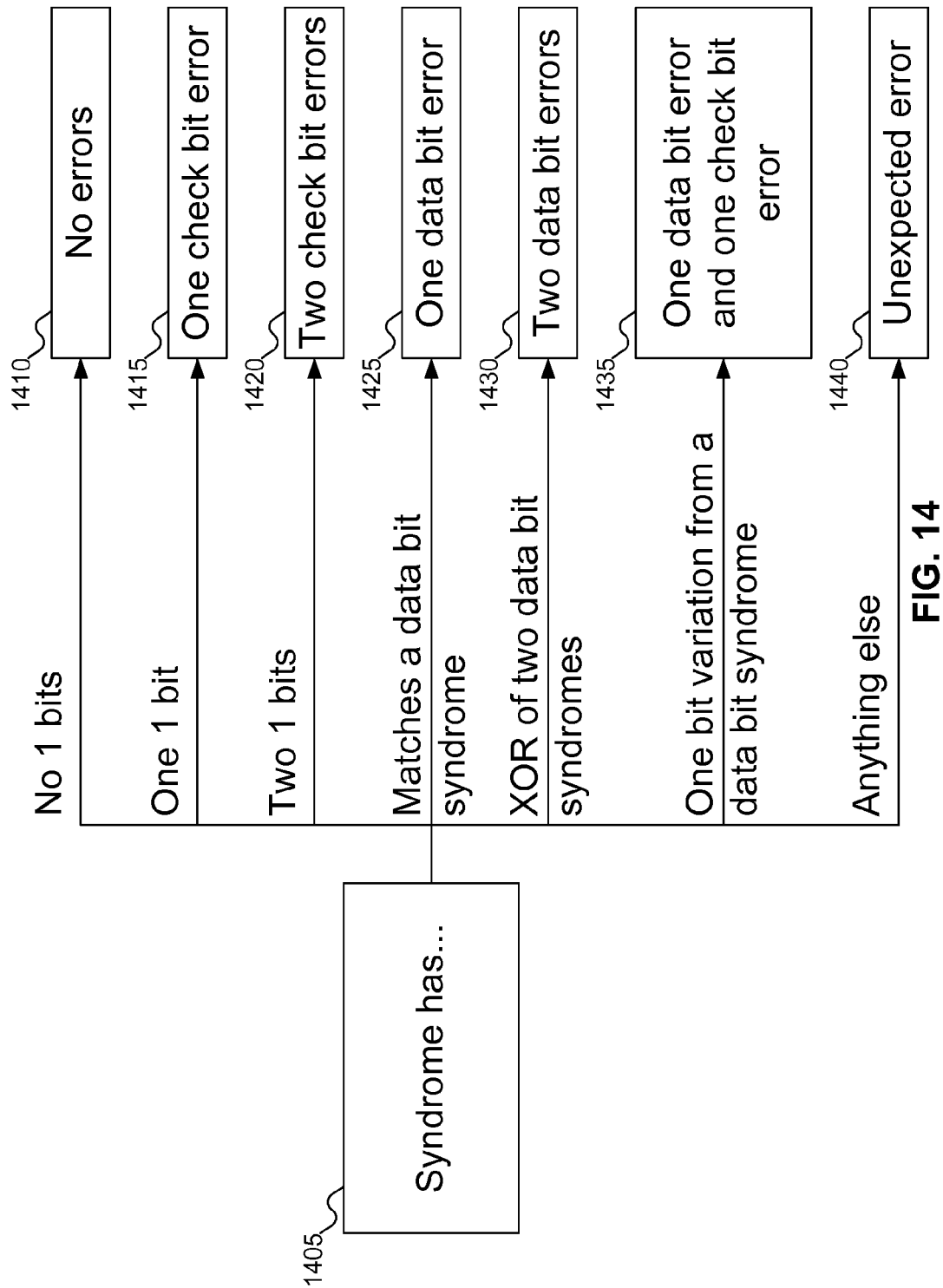
FIG. 14 shows a mapping of different syndrome values to different error conditions in the circuit of FIG. 13.

Turning to the generation of the syndrome value, as discussed above, the syndrome value is computed as the XOR of the check bits as computed by check bit circuitry 1330 and as read from check bit storage 1325. If there are C check bits used in the error correcting code, then there are $2^C$ possible values for the syndrome. But most of these values are unlikely to occur. That is, the number of syndrome values that are meaningful is small relative to the space of all possible syndrome values. FIG. 14 shows a mapping of different syndrome values to different error conditions in the circuit of FIG. 13.

FIG. 14 shows an example mapping for different syndrome values to different error conditions using an error correcting code that can correct for up to two bit errors. But the mapping shown in FIG. 14 can be generalized to handle any number of bit errors. As shown in FIG. 14, if syndrome 1405 has no bits set to 1, that means that the check bits as read from check bit storage 1325 matched the check bits computed by check bit circuitry 1330. Since the check bits matched, there were no errors in the data, as shown as result 1410. If syndrome 1405 has one bit set to 1, then there was an error in a single check bit, as shown in result 1415. Similarly, if syndrome 1405 has two bits set to 1, then there were two check bit errors, as shown in result 1420. (The technique used to generate the check bits in check bit circuitry 1320 and 1330 guarantees that a syndrome cannot have either one or two bits set to 1 due to any combination of data bit errors—at least, within the tolerance of the error correcting code.)

There are specific patterns that will occur in syndrome 1405 if exactly one data bit, as read from data storage 1315, differs from the data bits input to module 1305 via line 1310. These patterns can be generated in advance and stored (for example, within correction vector circuitry 1345), and can be compared against syndrome 1405. Thus, if syndrome 1405 has a bit pattern that matches a pattern indicating a single bit error, then there is a single data bit error, as shown in result 1425. In addition, if exactly two data bits, as read from data storage 1315, differ from the data bits input to module 1305 via line 1310, then syndrome 1405 will match an XOR of two bit patterns indicating those single bit errors. Thus, if syndrome 1405 matches an XOR of two bit patterns indicating single bit errors, then there is a double data bit error, as shown in result 1430. As with the single data bit error, the XOR of all possible pairs of single data bit errors can be generated in advance and stored, to make the comparison against syndrome 1405 simpler and faster.

If there are two errors, one in a data bit and one in a check bit, then the result is a syndrome that differs from a single data bit error in one bit. Note that this one bit difference can be either a bit set to 1 (that is, a check bit that should not have been set but was) or a bit set to 0 (that is, a check bit that should have been set but was not). Algorithmically, this situation can be expressed as an XOR of the check bits for a single data bit error and a single check bit set to 1. If syndrome 1405 has a pattern that matches a single data bit error but for one check bit, then there is both a single data bit error and a single check bit error, as shown by result 1435. As with the patterns for data bit errors, these patterns that combine a data bit and a check bit error can be generated in advance and stored.

Finally, it might happen that the syndrome does not match any of the patterns described above. If this situation occurs, then there has been an unexpected error, as shown in result 1440. An example of such an unexpected error is where the number of bits in error exceeds the correction capacity of the code. An unexpected error can be handled in any desired manner (such as throwing an exception), since the error correcting code cannot correct for the error.

A syndrome to error position table can be pre-computed once a check bit mapping solution is known. Check bit errors are easily identified since they are simple powers of 2: 0x0001 is check bit 0, 0x0002 is check bit 1, and so on. Similarly, all double check bit errors will map to syndrome values that have only two 1 bits, with each being a check bit pointer based on the "power of 2" rule for single check bit errors. Errors that are a combination of a data bit and a check bit are the data bit syndrome XORed with and additional "power of 2" check bit syndrome.

As discussed above, one property of syndrome 1405 is that the number of syndrome values that identify errors is small relative to the space of all possible syndrome values. Specifically, if there are C check bits, there is only one possible syndrome value that indicates no errors; there are C possible syndrome values that indicate a single bit error (of either a data bit or a check bit), there are C·(C−1) possible syndrome values that indicate two check bit errors or two data bit errors, and $C^2$ possible syndrome values that indicate one data bit error and one check bit error. Thus, the total of all meaningful syndrome values is $3C^2+1$ out of the $2^C$ possible syndrome values. Of course, if the number of check bits is kept constant and the error correcting code is designed to correct more than two bit errors, a greater percentage of possible syndrome values are meaningful, but even so, the percentage of meaningful syndrome values remains small relative to the space including all possible syndrome values.

A few consequences of the interpretation of the syndrome value, as shown in FIG. 14, can be inferred. First, note that a syndrome value will have a bit set to 1 for each check bit that is incorrectly read from check bit storage 1325. Therefore, any syndrome value that identifies a data bit error has more than this number of bits set to 1. So, if the error correcting code is designed to correct up to E bit errors, then the number of bits set to 1 in a syndrome identifying a data bit error has at least E+1 bits set to 1. Put another way, if a syndrome value identifying a data bit error were to have no more than E bits set to 1, the syndrome could not distinguish between the data bit error and a set of check bit errors.

A second consequence of the interpretation of the syndrome value is that any data bit is used in at least E different check bits. The reason is simple. Assume that a data bit were used in only 1 check bit (this assumption reduces the scenario to a trivial case for understanding, but can be generalized to any number of check bits that is fewer than E). If that data bit were read incorrectly from data bit storage 1315, then only one check bit would be set to 1. The syndrome value would then not be able to distinguish between the data bit being read incorrectly or that check bit being read incorrectly.

Turning to correction vector circuitry 1345, as discussed above, correction vector circuitry 1345 takes a syndrome and generates an appropriate correction vector to correct for bit errors. Since each syndrome is a unique fault identifier, a correction vector that identifies the bit or bits to be corrected can be produced from a simple AND-OR structure using just the syndrome bits. That is, all syndrome values that map to a particular correction vector can be ANDed together, and all the possible resulting correction vectors can be ORed together, returning the appropriate correction vector for a particular syndrome value. Note that while each meaningful syndrome value represents a different error condition, different syndrome values can result in the same correction vector. For example, check bit errors, while important to catch, do not need to be corrected as part of reading the data, since the application only needs the data bits. Thus, for example, a syndrome value that identifies an error in data bit 1 and syndrome values that identify errors in both data bit 1 and any check bit can map to the same correction vector.

Other error correcting codes exist. But using embodiments of the inventive concept has advantages over such error correcting codes. Embodiments of the inventive concept are capable of correcting multiple data faults, such as might occur if there was a soft error (SEU) in a word along with a hard manufacturing fault. In addition, embodiments of the inventive concept include a much simpler implementation structure. For example, a BCH(63,51,5) code can correct up to 2 errors in a 32 bit data word using a 12 bit check word. But such a code requires 32 levels of XOR gating (assuming that the other 31 extra code bits are bypassed) for the check bit generation and syndrome computation. Further, once the syndrome has been computed, there remains a multiple level computation to derive the error locations. In contrast, embodiments of the inventive concept allow the check bits to be computed in parallel and the error locations to be directly mapped, making embodiments of the inventive concept more appropriate for situations with high speed timing constraints, such as a RAM application.

Appendix B

This appendix includes a portion of the disclosure from U.S. patent application Ser. No. 14/751,126, titled "MULTIPLE ECC CHECKING MECHANISM WITH MULTI-BIT HARD AND SOFT ERROR CORRECTION CAPABILITY", filed Jun. 25, 2015.

A small number of manufacturing faults in embedded (Random Access Memory) RAM can be tolerated if the existence of the fault is known to the error correcting code (ECC) mechanism. The RAM fault information used in this enhanced correction method is a list of the locations with a single Stuck-At fault and the bit position that has the fault, called the hard fault table. The polarity of the bit fault (Stuck-At-0 or Stuck-At-1) is not required. The fault location information (word and bit) can be used as the data is read from RAM, so a direct-mapped structure such as a Read-Only Memory (ROM) or a content-addressable memory (CAM) can be used. The information is used to generate a correction vector which is the same width as the RAM data word and is all zeros when a fault-free location is accessed, and has a single one, in the bit position with the fault, for locations with a hard fault. The correction vector can be exclusive-ORed (XOR) with the RAM read data to create an alternate data value where the bit with the hard fault has the opposite state from its Stuck-At value.

The ECC mechanism uses two single-error correcting/double-error detecting (SEC/DED) ECC checkers that can operate in parallel. The primary ECC checker (ECC1) receives the RAM data, which is comprised of data and check bits. A second ECC checker (ECC2) receives the alternate copy of the RAM data after the application of the correction vector. The results from the two ECC checks are then compared using a set of rules, which indicate what the correct data should be for output.

Figure 15:
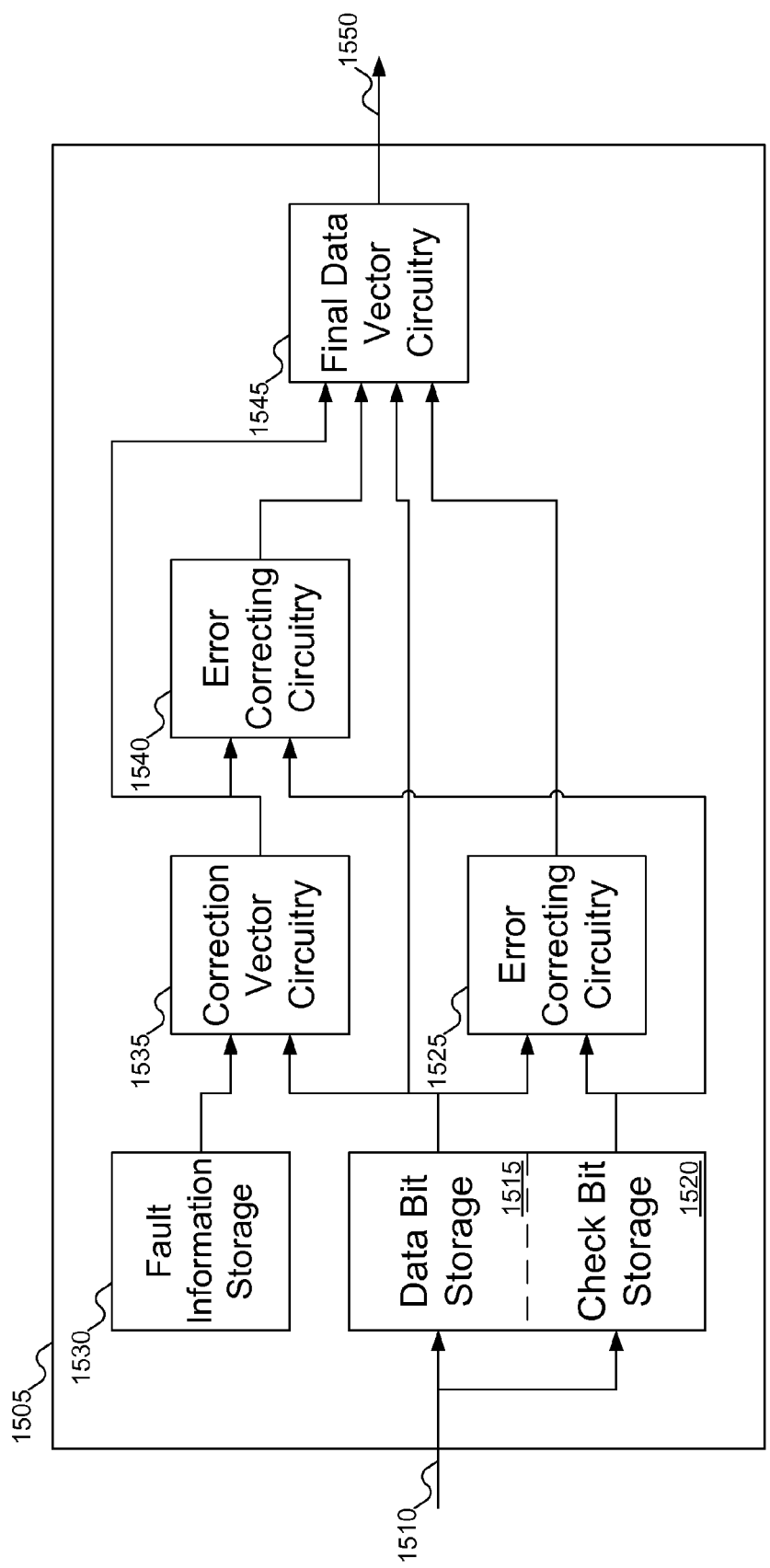
FIG. 15 shows a circuit that can use error correcting codes to correct multi-bit errors, according to an embodiment of the inventive concept.

FIG. 15 shows a circuit that can use error correcting codes to correct multi-bit errors, according to an embodiment of the inventive concept. In FIG. 15, circuit 1505 can be incorporated in a memory module, such as in RAM. But circuit 1505 can be incorporated into any module that includes data storage, such as caches on a processor.

A data vector (that is, a set of data bits, which can also be called a data word) can be input via line 1510. The data vector can be stored in data bit storage 1515. Circuit 1505 does not show control inputs, such as a line for indicating whether data is to be read or written. In addition, circuit 1505 can be generalized to any desired memory configuration, including data that can be read or written in parallel, among other possibilities.

A check vector (that is, a set of check bits) can also be input via line 1510, and can be stored in check bit storage 1520. The check vector can be generated using any desired ECC algorithm, such as an SEC/DED Hamming code. In FIG. 15, the check vector can be generated before the data vector into data bit storage 1515, but it is also possible for the check vector to be generated using ECC circuitry within circuit 1505 before the data vector is stored in data bit storage 1515.

While FIG. 15 shows data bit storage 1515 as distinct from check bit storage 1520, the check bits can be stored intermixed with the data bits, within a single storage element. All that matters is that the check bits can be processed as check bits, rather than as data bits. Similarly, while the above description might be read as suggesting that the data vector and the check vector are input at different times, the data vector and the check vector can be input at the time.

When the data vector is read from data bit storage 1515, the check vector can also be read from check bit storage 1520. These vectors can be input into error correcting circuitry 1525 (referred to above as ECC1), which can determine if the check vector is consistent with the data vector. One way in which ECC1 1525 can operate is to use the check vector to correct any errors in data vector, as would normally happen in using the ECC code. Another way in which ECC1 1525 can operate is to recalculate the check vector from the data vector as read from data bit storage 1515 and compare the result with the check vector as read from check bit storage 1520. Regardless of the manner in which ECC1 1525 operates, the result is an indication of whether the number of bits in error (between the data vector and the check vector) is zero, one, or more than one (a multi-bit error).

Circuit 1505 also includes fault information storage 1530, sometimes called a hard fault table, which stores information about the bits in data bit storage 1515 that have Stuck-At faults. As noted above, fault information storage 1530 indicates whether a bit is Stuck or not; fault information storage 1530 does not need to store whether the bits are Stuck at 0 or 1. But a person of ordinary skill in the art will recognize that fault information storage 1530 could include additional information, such as whether the bit is Stuck at 0 or 1, without affecting the operation of embodiments of the inventive concept.

Fault information storage 1530, since it can store information about bits that were defective at the time of manufacture of the storage, can be pre-computed: either at the time of manufacture or sometime thereafter. Fault information storage 1530 can be a direct-mapped structure such as Read-Only Memory (ROM) or content-addressable memory (CAM) can be used, among other possibilities. Fault information storage 1530 can also be writeable storage, in case additional bits become stuck after manufacture.

The information from fault information storage 1530 can be fed into correction vector circuitry 1535. Correction vector circuitry 1535 can also receive a copy of the data vector from data bit storage 1515. Correction vector circuitry 1535 can then use the information from fault information storage 1530 to produce an alternate data vector. Effectively, alternate data vector can be the original data vector, but with the values of the bits flipped where fault information storage 1530 indicates a bit is stuck. Correction vector circuitry 1535 is discussed further with reference to FIG. 16 below.

In addition to ECC1 1525, circuit 1505 can include ECC2 1540. ECC2 1540 is functionally the same as ECC1 1525, except that ECC2 1540 operates on the alternate data vector, rather than the data vector read from data bit storage 1515. In effect, ECC2 1540 assumes that every Stuck bit in the data vector was actually intended to have the other binary value, and checks to see if the check vector is consistent with that alternate data vector.

The results of ECC1 1525 and ECC2 1540, along with the original and alternate data vectors, can then be input into final data vector circuitry 1545. Final data vector circuitry can then determine if the data vector, as read from data bit storage 1515, requires correction; if correction is required, whether the data vector can be corrected; and, if the data vector can be corrected, how to correct it. As a result, the output of circuitry 1505 can be the desired data vector, as originally written to data bit storage 1515 (despite potential hard or soft errors, if they can be corrected).

Final data vector circuitry 1545 can use various rules to determine what to output as the final data vector. These rules can include the following:

1) If both ECC1 1525 and ECC2 1540 indicate no error, then the original data vector has no errors and can be output without correction. This situation can arise when there are no errors (either Stuck-At bits or soft errors), or when any Stuck-At bits match the data (that is, the value stored for the bit is the same as the value to which that bit is stuck).

2) If ECC1 1525 indicates a single bit error (SBE) at bit A, and ECC2 1540 indicates no error, then there was a single bit error due to the known Stuck-At fault, and the alternate data vector can be output without correction.

3) If ECC1 1525 and ECC2 1540 both indicate SBEs in the same bit position, then the error is a soft error (SEU) and the original data vector can be used after correction using the check vector.

4) If ECC1 1525 indicates a multi-bit error (MBE) and ECC2 1540 indicates a SBE, then the bit identified by ECC2 1540 was a SEU, and the other bit identified by ECC1 1525 was a Stuck-At error. The alternate data vector can be used after correction using the check vector.

5) If ECC1 1525 and ECC2 1540 both indicate a MBE then there was a multiple bit SEU, which cannot be corrected.

6) If ECC1 1525 indicates a SBE, and ECC2 1540 indicates a MBE then a multi-bit SEU and a Stuck-At occurred, which cannot be corrected.

These rules can be grouped into four categories:

1) No error observed: either there are no errors in the data vector or any Stuck-At bits match the values written to those bits.

2) A SBE (either a SEU or a Stuck-At bit that does not match the value written to the bit): the error can be corrected using the error correcting code. Note that a SEU would have occurred on a bit that is not identified as a Stuck-At bit in fault information table 1530.

3) Both a SEU and a Stuck-At bit: the Stuck-At bit can be corrected using fault information table 1530 and the SEU can be corrected using the error correcting code and the check vector.

4) Any other MBE: error correction cannot be performed.

Yet another way to look at embodiments of the inventive concept is to assign a code to ECC1 1525 and ECC2 1540. The code can include the letters: Z, meaning zero errors; S, meaning a single-bit correctable error; and M, meaning a multi-bit error that the ECC cannot correct by itself. Note that M indicates that the individual circuit, either ECC1 1525 or ECC2 1530 cannot, by itself, correct the multi-bit error; M does not mean that the error in the data vector is uncorrectable by circuit 1505.

Using this code for ECC1 1525 and ECC2 1540, the results of both error correcting circuits can be generated as the concatenation of the two individual codes. The possible results can be represented as the set {ZZ, ZS, SZ, SS, MS, MM, SM}. (Note that ZM and MZ are not possible cases: if one ECC indicates a multi-bit error, it is not possible for the other ECC to indicate no errors at all.) The choices for error correction are: Use ECC1 1525 checker action, use ECC2 1540 checker action, or indicate a multi-bit error. The correct action can be determined by a simple precedence sequence:

1) If fault information storage 1530 indicates that there is no Stuck-At bit cell in the data vector, then ECC1 1525 and ECC2 1540 results should be identical and the result of ECC1 1525 result can be used.

2) Otherwise, if ECC2 1540 indicates a MBE, correct the MBE using ECC2 1540.

Otherwise, use the result of either ECC1 1525 or ECC2 1540, depending on which indicates the better result, where Z is better than S, and S is better than M.

Embodiments of the inventive concept provide a tradeoff. Instead of discarding storage modules that have hard faults, these modules can now be used. The tradeoff is that the module's storage capacity is reduced by the capacity of fault information storage 1530, and the module requires added space for the logic of circuit 1505.

Although the embodiment of the inventive concept described above can handle one Stuck-At bit (hard fault), other embodiments of the inventive concept can support more than one Stuck-At bit. The number of error correcting circuits required to handle n hard faults is $2^n$. Thus, 2 ECCs are required to handle one hard fault, 4 ECCs are required to handle 2 hard faults, and so on.

Figure 16:
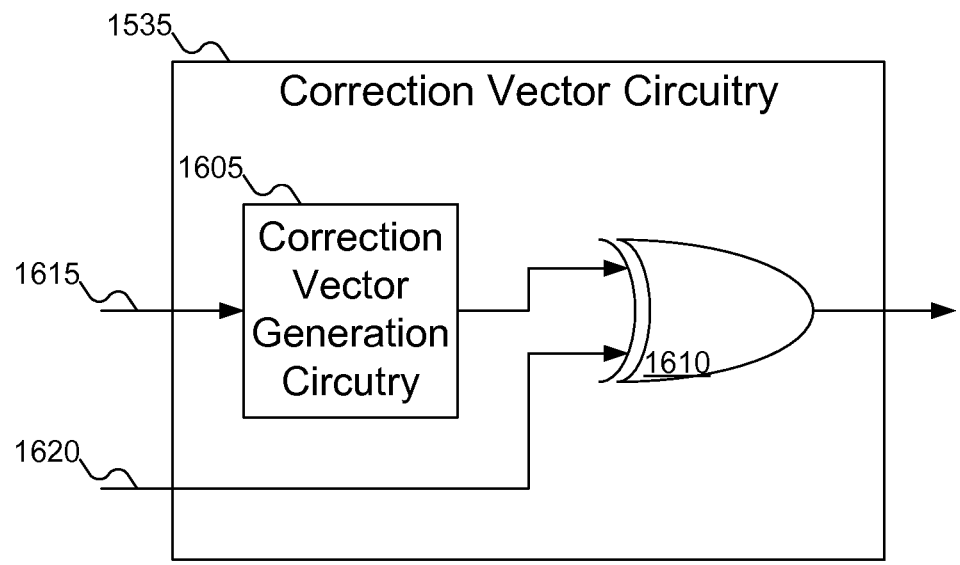
FIG. 16 shows details of the correction vector circuitry of FIG. 15.

Turning to FIG. 16, FIG. 16 shows details of the correction vector circuitry of FIG. 15. In FIG. 16, correction vector circuitry 1535 is shown as including correction vector generation circuitry 1605 and XOR gate 1610. Correction vector generation circuitry 1605, as the name implies, can generate a correction vector that can be applied to a data vector. Correction vector generation circuitry 1605 can receive information from fault information storage 1530 of FIG. 15 via line 1615 to generate the correction vector. The correction vector can then be XORed with the data vector, which can be received via line 1620, to generate the alternate data vector.

Figure 17:
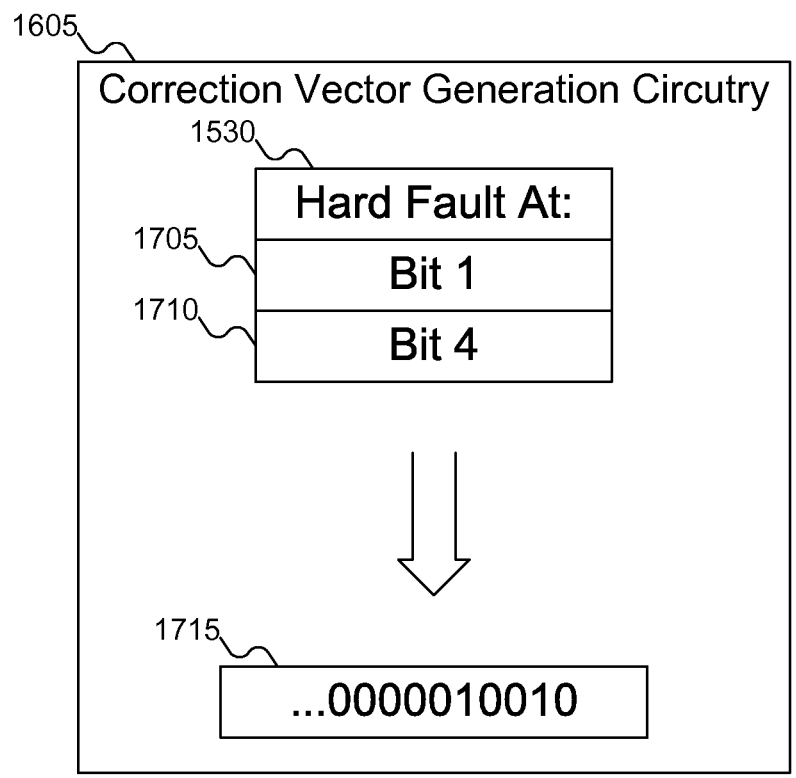
FIG. 17 shows details of the correction vector generation circuitry of FIG. 16.

FIG. 17 shows details of the correction vector generation circuitry of FIG. 16 in another embodiment of the inventive concept. In FIG. 17, fault information storage 1530 is stored within correction vector generation circuitry 1605, rather than externally to correction vector generation circuitry 1605 (as shown in FIG. 15). In FIG. 17, fault information storage 1530 is shown as indicating that two bits 1705 and 1710, specifically bits 1 and 4, have Stuck-At faults. From this, correction vector 1715 can be generated. Correction vector 1715 can include 1 bits at the positions indicated as being Stuck. As can be seen (with bit 0 as the least significant bit at the right of correction vector 1715), the only bits in correction vector 1715 that are set to 1 are bits 1 and 4: all other bits are set to 0. This correction vector can then be XORed with the data vector to change the value of the bits in the data vector that are Stuck, resulting in the alternate data vector.

FIG. 18 shows a chart of different possible cases based on the results of the error correcting circuitries of FIG. 15. In FIG. 18, table 1805 shows the possible cases for how to correct the data vector read from data bit storage 1515, if the data vector requires correction and can be corrected. Because table 1805 only considers two ECCs, table 1805 corresponds to an embodiment of the inventive concept as shown in FIG. 15. But as noted above, more than two errors can be handled by increasing the number of ECCs, with a corresponding increase in the number of dimensions to table 1805.

Returning to the embodiment of the inventive concept shown in FIG. 18, there are three possible results generated by error correcting circuitry 1525 of FIG. 15: no error, a single bit error, or a multi-bit error. Similarly, there are three possible results generated by error correcting circuitry 1540: no error, a single bit error, or a multi-bit error. Therefore, there are nine possible results.

If neither ECC1 1525 nor ECC2 1540 indicates an error, then the data vector does not require correction, as indicated in cell 1810. If ECC1 1525 indicates no error, but ECC2 1540 indicates either a single bit or multi-bit error, then there is an uncorrectable error in the data vector, as indicated in cells 1815 and 1820. Note that cell 1820 corresponds to the case coded ZM, which is not a possible combination.

If ECC1 1525 indicates a single bit error but ECC2 1540 indicates no error, then there was a single bit that was Stuck at the wrong value (that is, the bit was Stuck at 0 when the value written was 1, or the bit was Stuck at 1 when the value written was 0). Since the alternate data vector had no errors, the alternate data value should be used in place of the data vector, as indicated in cell 1825.

If ECC1 1525 and ECC2 1540 both indicate a single bit error, there are two possible cases. Either both ECCs indicate a single bit error at the bit, or they indicate single bit errors at different bits. If both ECCs indicate a single bit error at the same bit, then that bit was subject to a soft error, and the data vector can be used after correcting the soft error using an ECC (either ECC1 1525 or ECC2 1540 can be used). If ECC1 1525 and ECC2 1540 indicate different single bit errors, then the error is uncorrectable. Both these cases are indicated in cell 1830.

If ECC1 1525 indicates a single bit error and ECC2 1540 indicates a multi-bit error, then the data vector includes both a Stuck-At error and multiple soft errors. This combination of errors cannot be corrected, as indicated in cell 1835.

If ECC1 1525 indicates a multi-bit error and ECC2 1540 indicates no error, there is an uncorrectable error, as indicated in cell 1840. Note that cell 1840 corresponds to the cases coded MZ, which is not a possible combination. If ECC1 1525 indicates a multi-bit error and ECC2 1540 indicates a single bit error, then the data vector has both one soft error and one Stuck-At error. By using the alternate data vector and correcting it using ECC2, the correct data can be determined and output from circuit 1505, as indicated in cell 1845. Finally, if both ECC1 1525 and ECC2 1540 indicate multi-bit errors, then there are multiple soft errors, which cannot be corrected using circuit 1505, as indicated in cell 1850.

What is claimed is:

1. A memory module, comprising:
   a memory array;
   a memory controller for the memory array;
   a status register in the memory controller, the status register identifying whether the memory module is operating at a normal power level or a low power level; and
   storage for information defining at least one normal reliability region in the memory array and at least one low reliability region in the memory array when the memory module is operating at the low power level,
   wherein the memory module may be written to and read from normally at either the normal power level or the low power level.

2. A memory module according to claim 1, further comprising a region definer to define the at least one normal reliability region in the memory array and the at least one low reliability region in the memory array when the memory module is operating at the low power level.

3. A memory module according to claim 1, further comprising a mask register in the memory controller, the mask register specifying a reliability level for the at least one low reliability region.

4. A memory module according to claim 3, wherein the reliability level for the at least one low reliability region relates to a probability of a data error in the at least one low reliability region due to the memory module operating at the low power level.

5. A memory module according to claim 4, wherein the reliability level for the at least one low reliability region specifies the probability of the data error in the at least one low reliability region.

6. A memory module according to claim 1, further comprising error correcting code circuitry that can be applied to data stored in the at least one low reliability region in the memory address.

7. A memory module according to claim 6, wherein:
   the error correcting code circuity can be applied to a first data stored in a first region of the at least one low reliability region; and
   the memory module further comprises second error correcting code circuitry that can be applied to a second data stored in a second region of the at least one low reliability region.

8. A memory module according to claim 1, wherein the memory controller is operative to:
   receive a request to allocate a page of memory;
   access the status register; and
   allocate a page in the at least one normal reliability region or the at least one low reliability region.

9. A memory module according to claim 8, wherein, in response to the status register indicating that the memory module is operating at the low power level, the memory controller is operative to:
   receive a hint from an application regarding a reliability requirement of the application; and
   allocate the page in the at least one normal reliability region or the at least one low reliability region according to the hint from the application.

10. A memory module according to claim 9, wherein the memory controller is operative to:

receive the hint from the application that the application can use the at least one low reliability region; and allocate the page in the at least one low reliability region.

11. A system, comprising:
   a computer;
   a processor; and
   an operating system operative to run on the processor,
   wherein the operating system is operative to determine a power level for a memory module and to define at least one normal reliability region in the memory module and at least one low reliability region in the memory module,
   wherein the memory module may be written to and read from normally at either the normal power level or the low power level.

12. A system according to claim 11, wherein the operating system is operative to store in a status register in a memory controller the power level.

13. A system according to claim 11, wherein the operating system is operative to store in a mask register in a memory controller a reliability level for the at least one low reliability region.

14. A system according to claim 13, wherein the reliability level for the at least one low reliability region relates to a probability of a data error in the at least one low reliability region due to the memory module operating at the low power level.

15. A system according to claim 14, wherein the reliability level for the at least one low reliability region specifies the probability of the data error in the at least one low reliability region.

16. A system according to claim 11, further comprising an error correcting code that can be applied to data in a low reliability region in the memory array.

17. A method, comprising:
   determining a low power level for a memory in a computer;
   identifying at least one normal reliability region in the memory, based on the low power level;
   identifying at least one low reliability region in the memory, based on the low power level;
   setting a status register in a memory controller connected to the computer for the memory, the status register specifying whether the memory is operating at a normal power level or the low power level; and
   allocating a page of memory according to the status register and a reliability requirement of an application.

18. A method according to claim 17, further comprising applying an error correcting code to data stored in the at least one low reliability region.

19. A method according to claim 18, wherein:
   applying an error correcting code to data stored in the at least one low reliability region includes applying a first error correcting code to a first data stored in a first region of the at least one low reliability region; and
   the method further comprises applying a second error correcting code to a second data stored in a second region of the at least one low reliability region.

20. A method according to claim 17, wherein allocating a page of memory according to the status register and a reliability requirement of an application includes:

accessing the status register; and
in response to the status register indicating that the memory is operating at the normal power level, allocating any page in the memory.

21. A method according to claim 20, wherein allocating a page of memory according to the status register and a reliability requirement of an application further includes, in response to the status register indicating that the memory is operating at the low power level:
   receiving a hint from the application regarding the reliability requirement;
   allocating a page in the memory according to the hint from the application.

22. A method according to claim 21, wherein:
   receiving a hint from the application regarding the reliability requirement includes receiving a hint to use the low reliability region; and
   the method further comprising applying an error correcting code by the application.

23. A method according to claim 20, further comprising setting a mask register in the memory controller in the computer for the memory, the mask register specifying a reliability level for the at least one low reliability region.

24. A method according to claim 23, wherein the reliability level for the at least one low reliability region relates to a probability of a data error in the at least one low reliability region due to the memory module operating at the low power level.

25. A method according to claim 24, wherein the reliability level for the at least one low reliability region specifies the probability of the data error in the at least one low reliability region.

26. A method according to claim 17, wherein the memory module may be written to and read from normally at either the normal power level or the low power level.

27. A memory module, comprising:
   a memory array;
   a memory controller for the memory array;
   a status register in the memory controller, the status register identifying whether the memory module is operating at a normal power level or a low power level;
   storage for information defining at least one normal reliability region in the memory array and at least one low reliability region in the memory array when the memory module is operating at the low power level; and
   a mask register in the memory controller, the mask register specifying a reliability level for the at least one low reliability region,
   wherein the reliability level for the at least one low reliability region relates to a probability of a data error in the at least one low reliability region due to the memory module operating at the low power level.

28. A memory module according to claim 27, wherein the reliability level for the at least one low reliability region specifies the probability of the data error in the at least one low reliability region.

* * * * *